(12) United States Patent
Minemura et al.

(10) Patent No.: US 8,298,732 B2
(45) Date of Patent: Oct. 30, 2012

(54) EXPOSURE METHOD AND METHOD OF MAKING A SEMICONDUCTOR DEVICE

(75) Inventors: Masahiko Minemura, Yokohama (JP); Seiji Makino, Yokohama (JP); Kanji Takeuchi, Yokohama (JP); Noboru Sugiyama, Yokohama (JP); Kozo Ogino, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 80 days.

(21) Appl. No.: 13/017,615

(22) Filed: Jan. 31, 2011

(65) Prior Publication Data

US 2011/0207053 A1 Aug. 25, 2011

(30) Foreign Application Priority Data

Feb. 23, 2010 (JP) ................................ 2010-037792

(51) Int. Cl.
*G03C 5/00* (2006.01)

(52) U.S. Cl. .......... 430/30; 430/296; 430/328; 430/394; 430/942

(58) Field of Classification Search ............ 430/30, 430/296, 328, 394, 942
See application file for complete search history.

(56) References Cited

FOREIGN PATENT DOCUMENTS

JP 4-155812 A 5/1992

*Primary Examiner* — Christopher Young
(74) *Attorney, Agent, or Firm* — Westerman, Hattori, Daniels & Adrian, LLP

(57) ABSTRACT

An exposure method includes generating a reticle exposure pattern based on a target pattern, performing a lithography simulation based on the reticle exposure pattern to generate a simulation pattern that simulates a resist pattern formed by reticle exposure, generating differential data between the target pattern and the simulation pattern, generating a first electron-beam exposure pattern based on the differential data, generating a reticle based on the reticle exposure pattern, performing an optical exposure process with respect to a resist by use of the reticle, and performing an electron-beam exposure process with respect to the resist based on the first electron-beam exposure pattern.

10 Claims, 23 Drawing Sheets

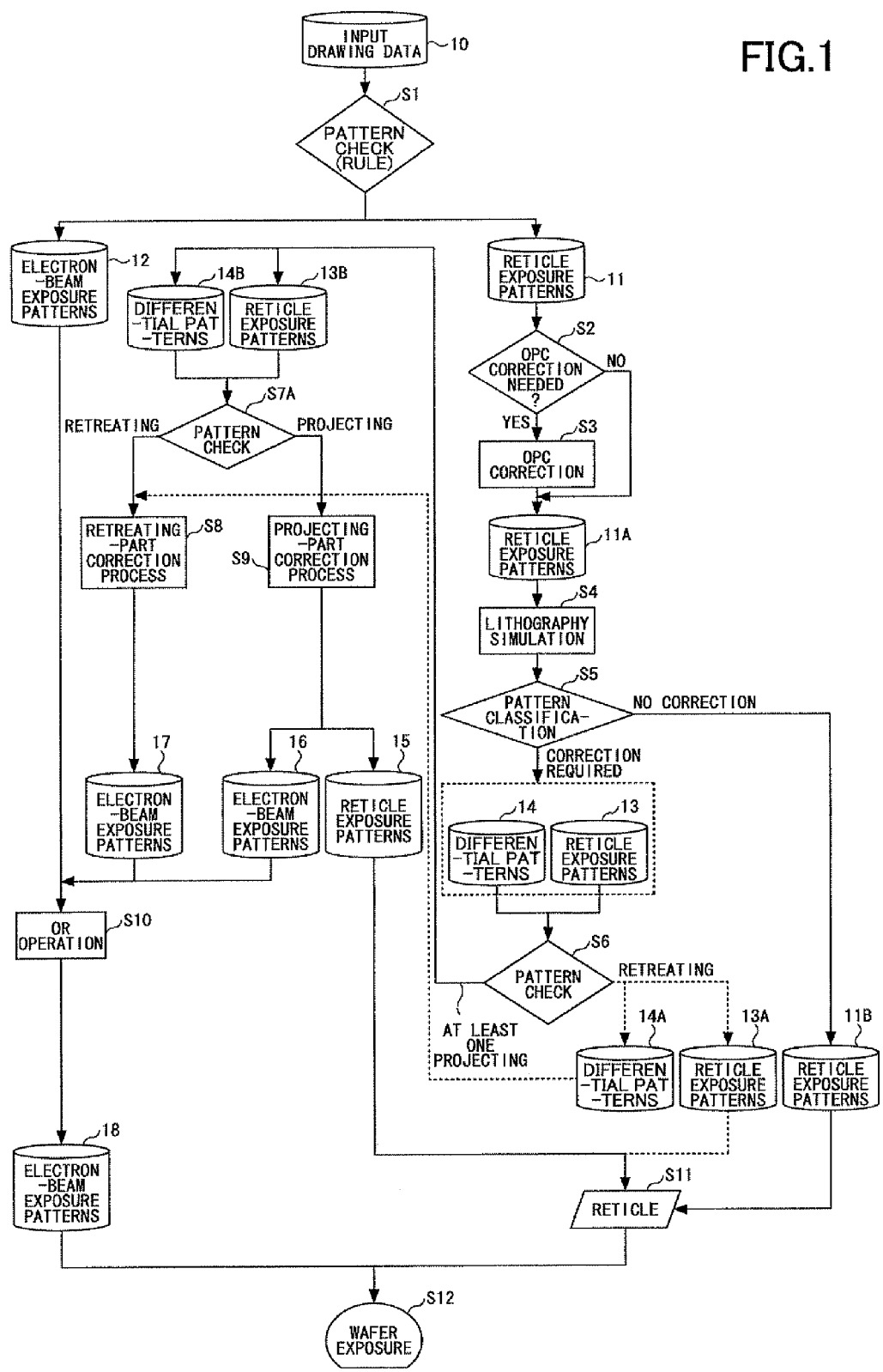

FIG.3

| LINE WIDTH \ INTERVAL | 85 | 90 | 95 |
|---|---|---|---|
| 90 | EB | EB | RT |
| 100 | RT | RT | RT |
| 110 | RT | RT | RT |

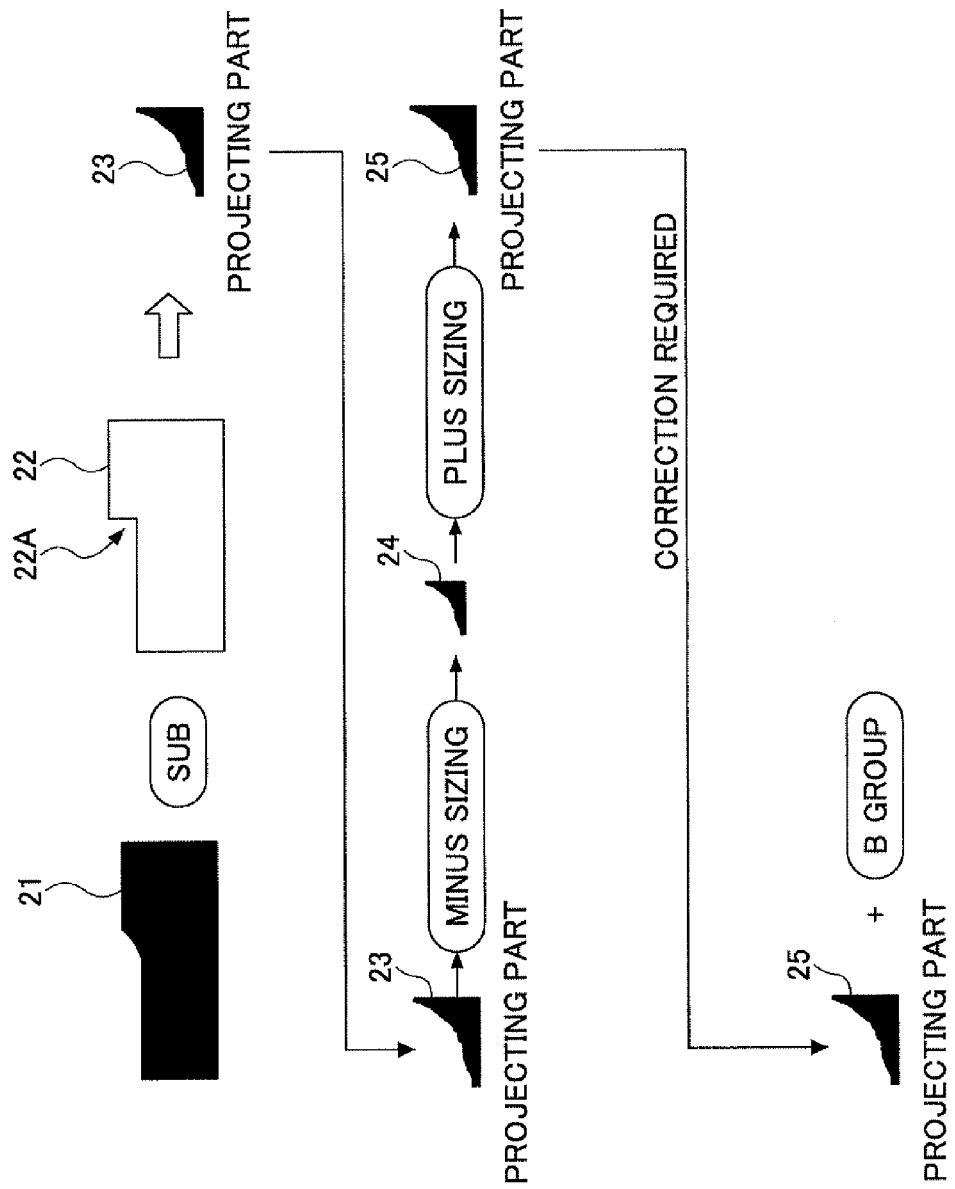

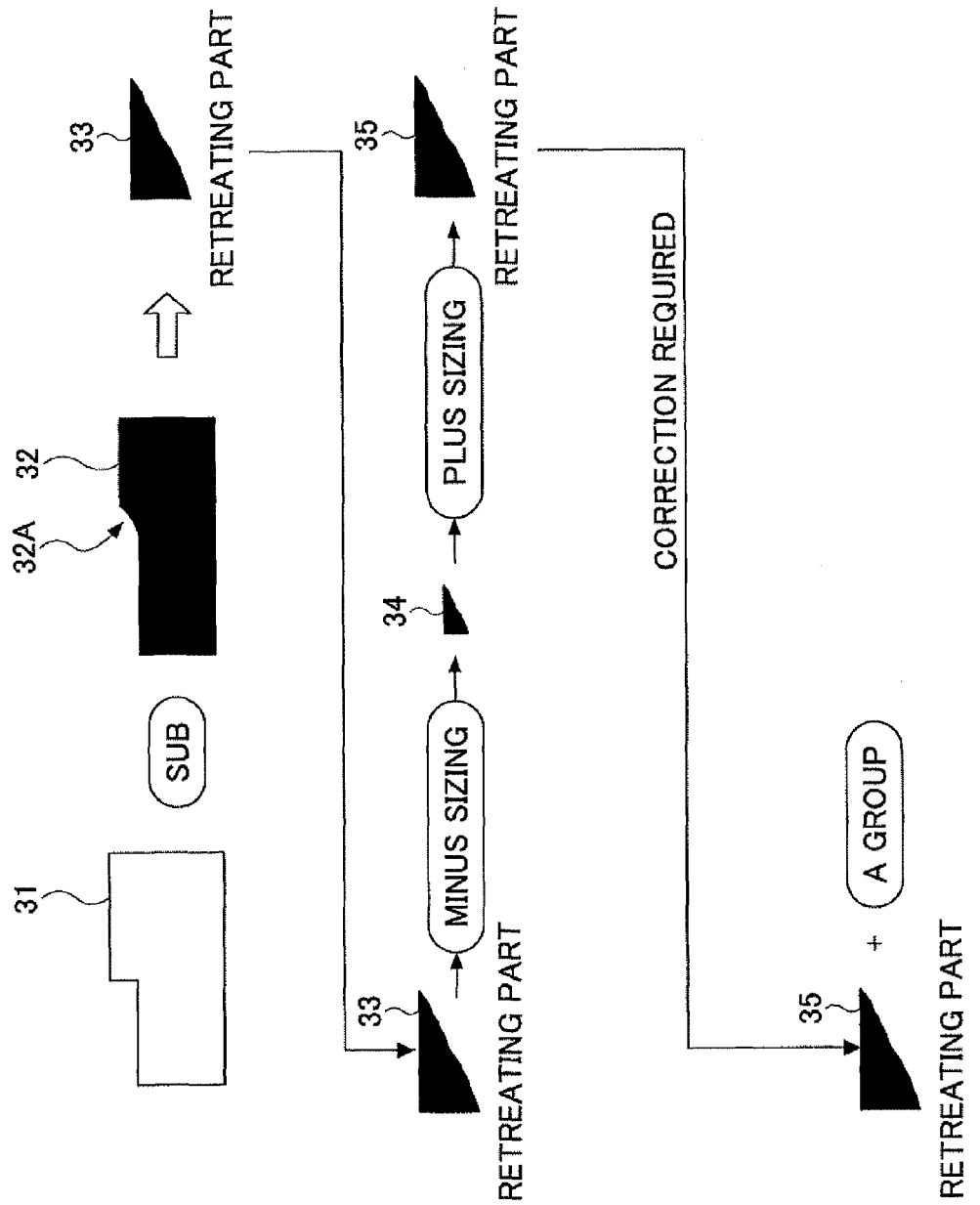

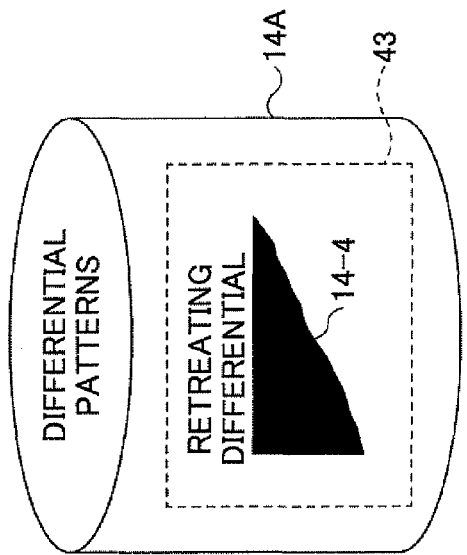
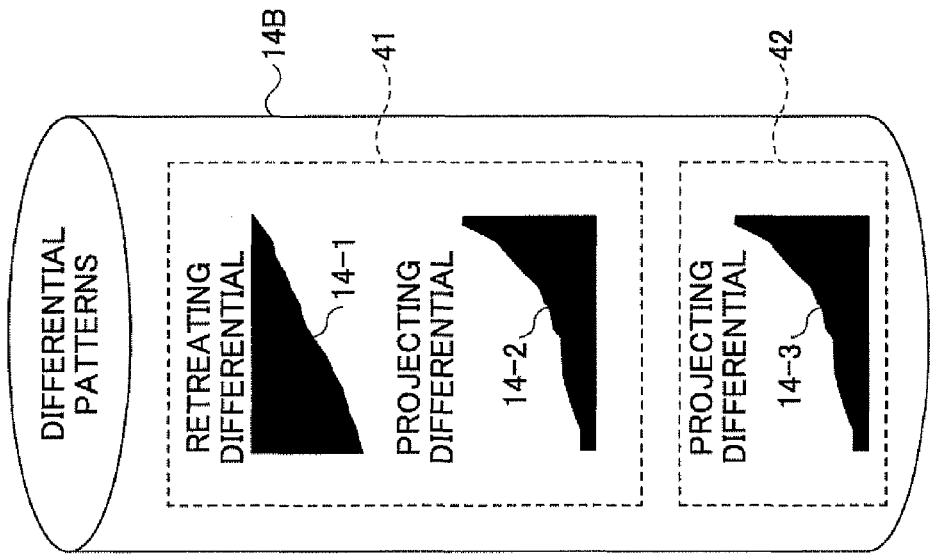

FIG.8A
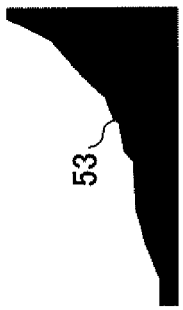
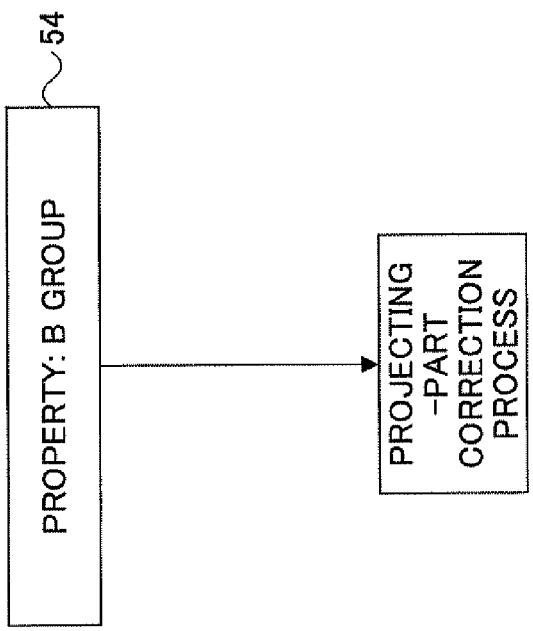
FIG.8B
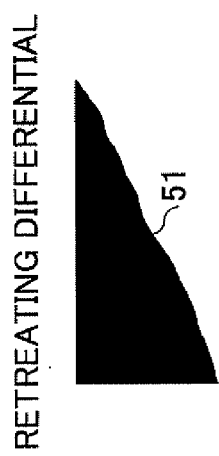
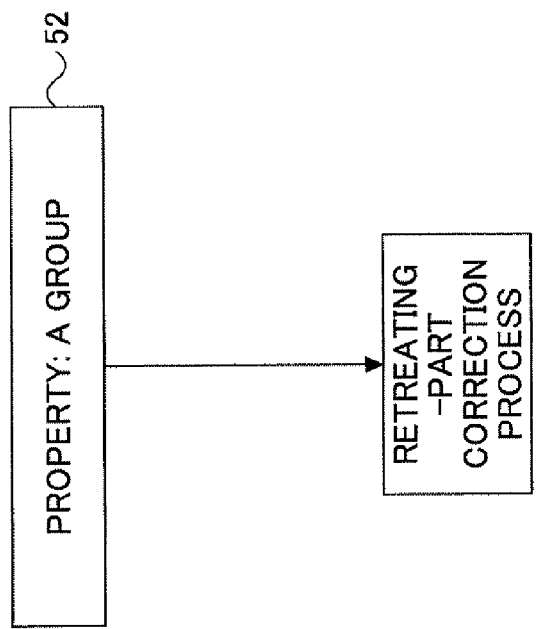

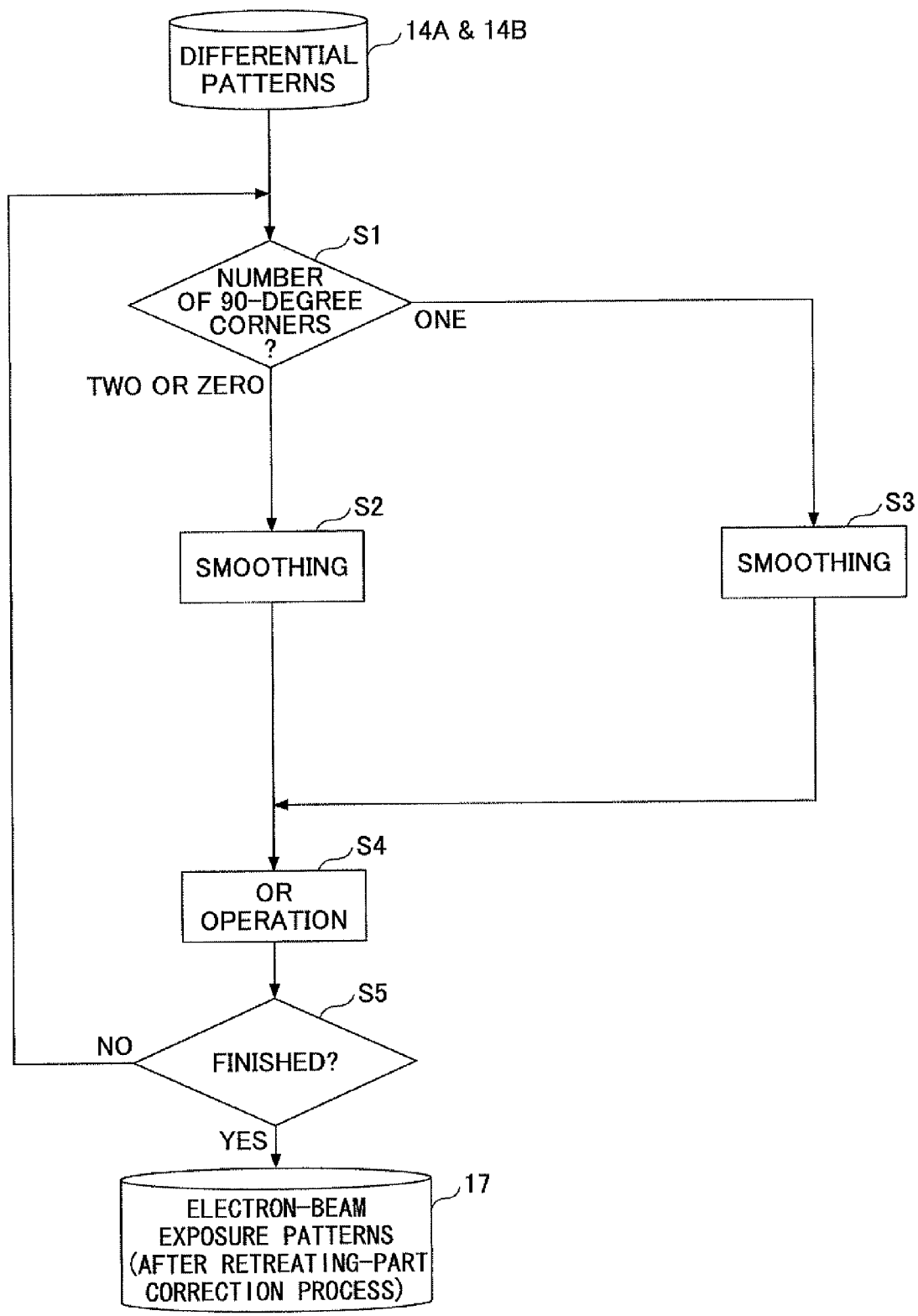

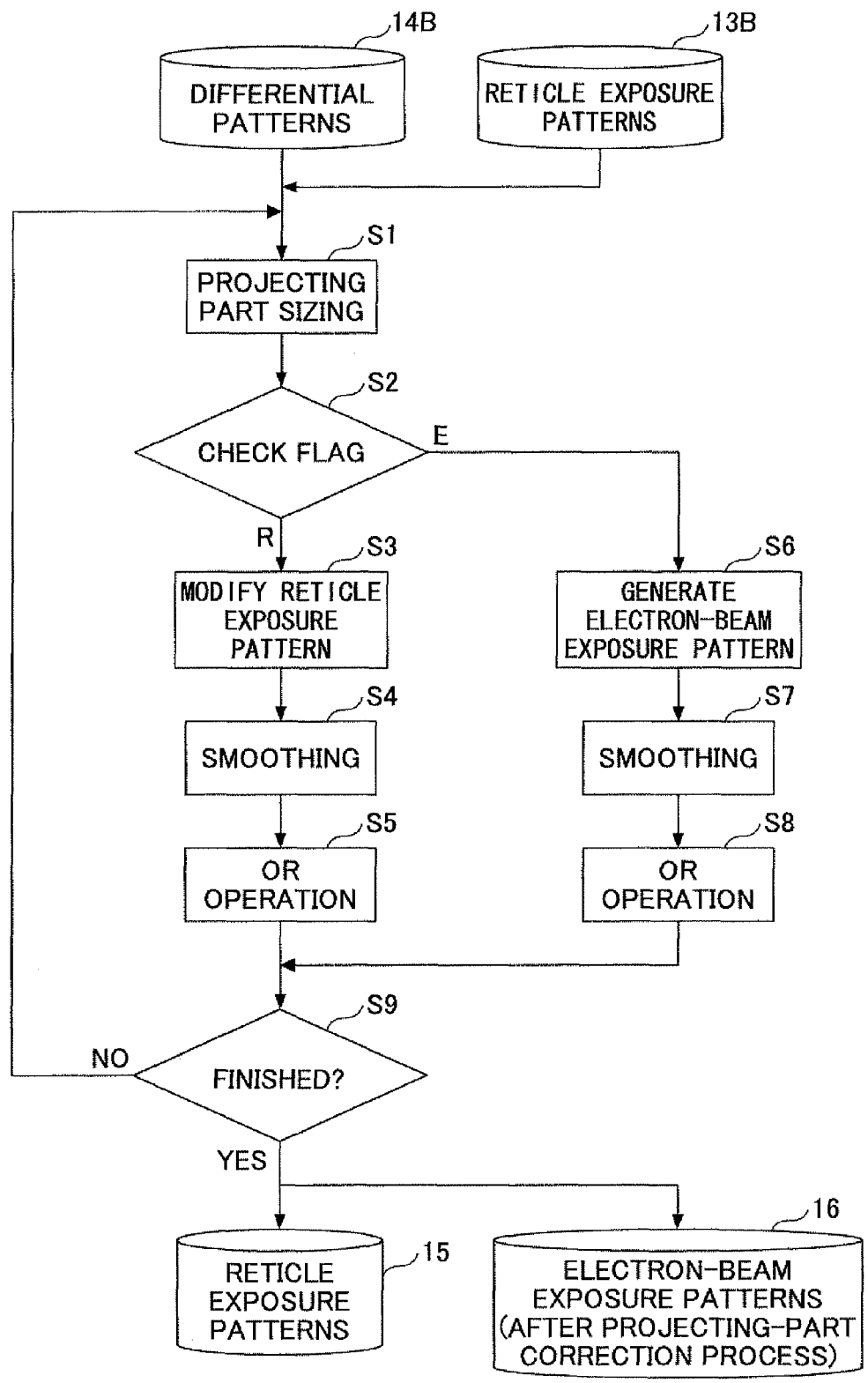

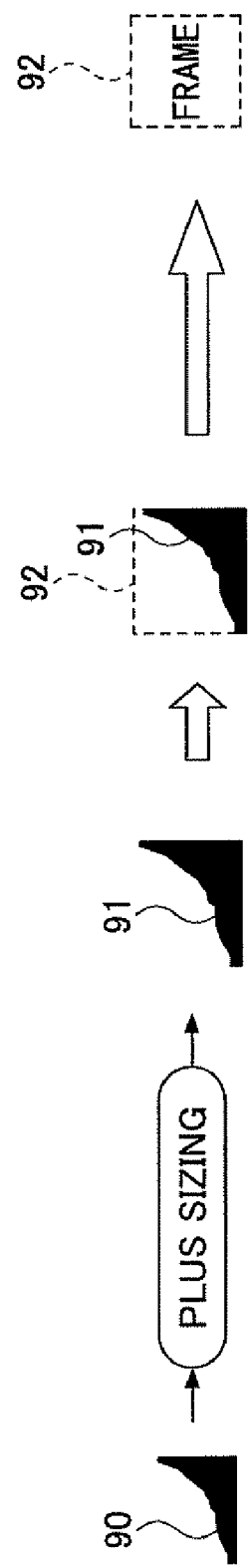

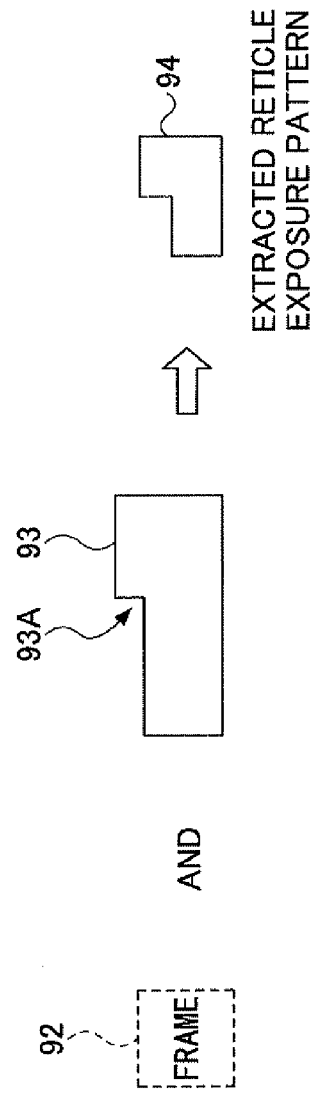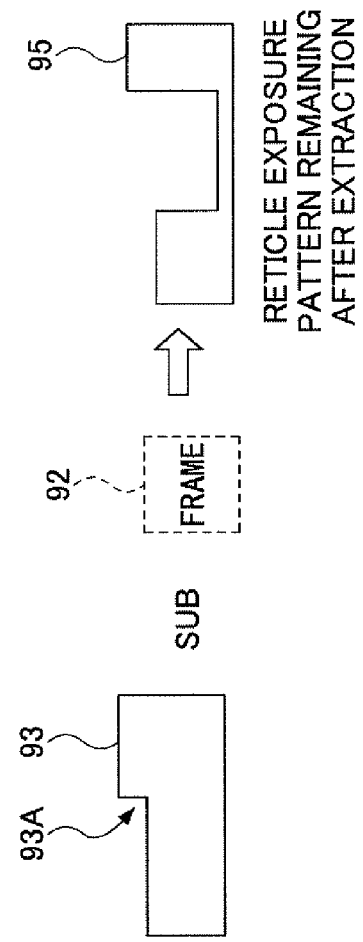

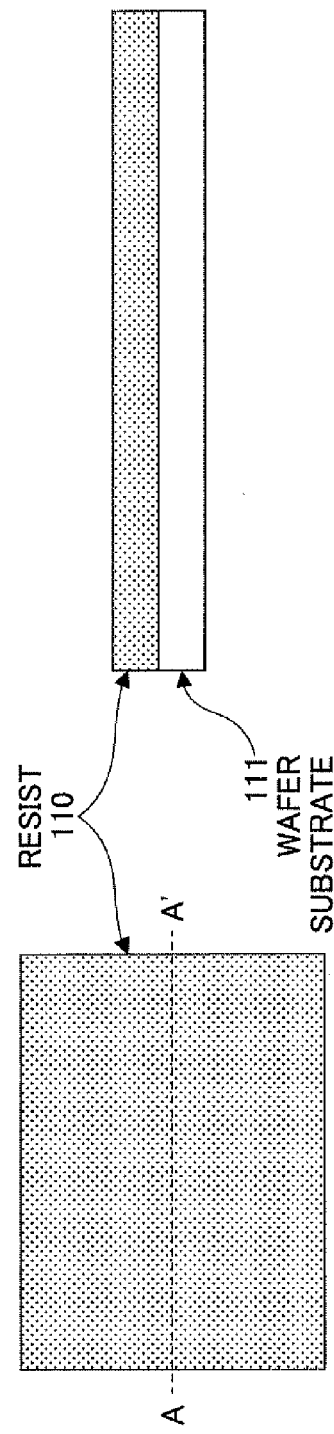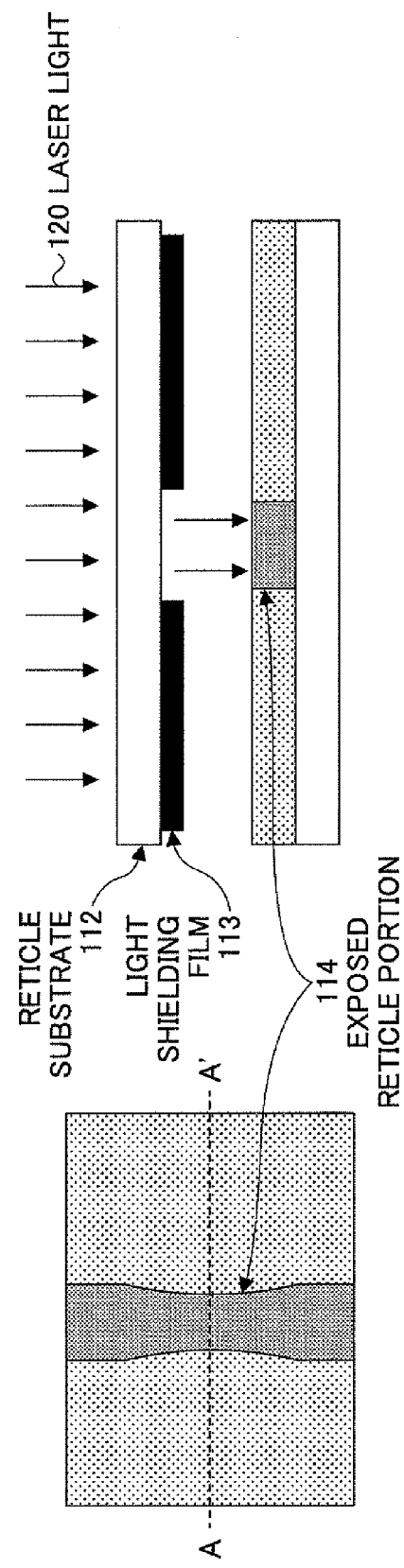

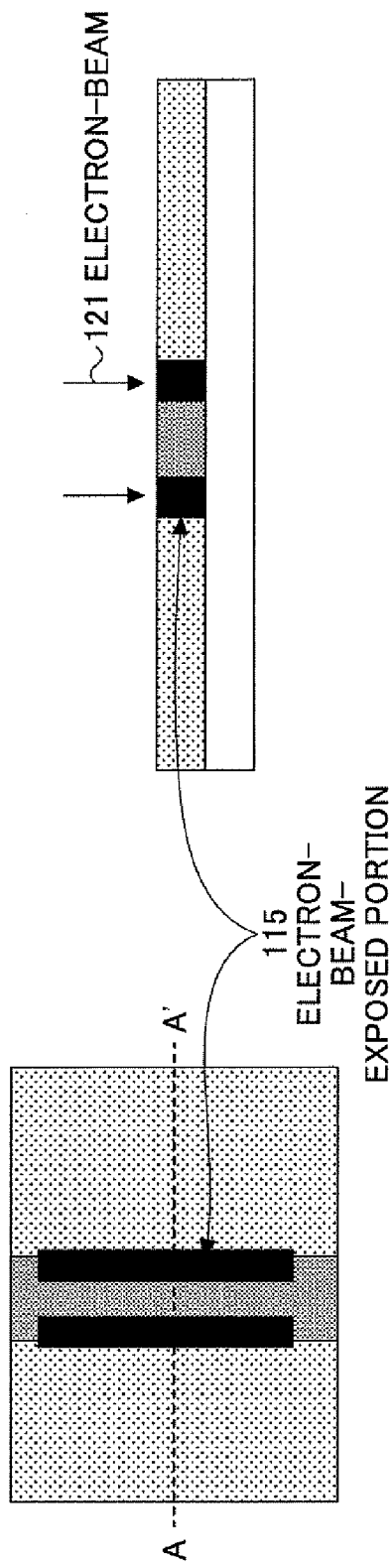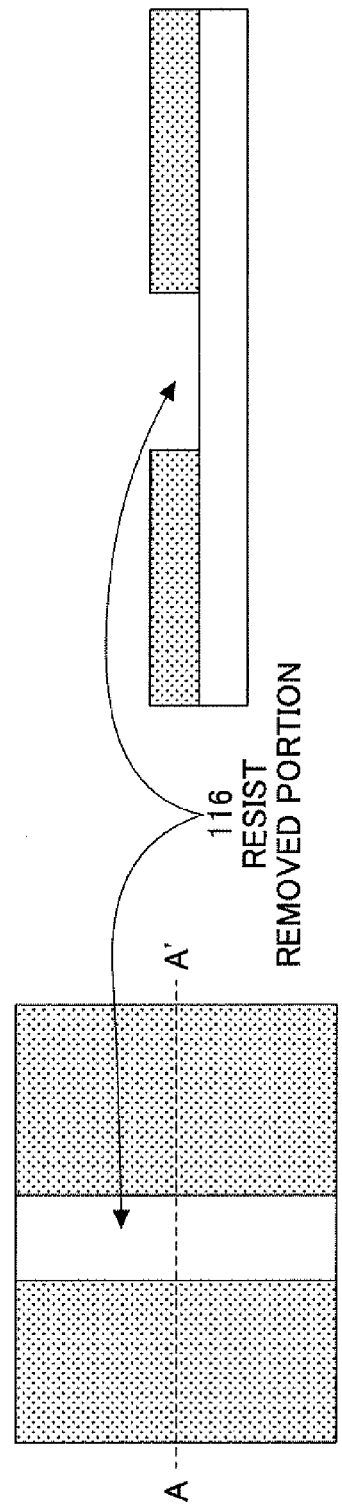
FIG.24C
FIG.24D

EXPOSURE METHOD AND METHOD OF MAKING A SEMICONDUCTOR DEVICE

CROSS-REFERENCE TO RELATED APPLICATIONS

The present application is based upon and claims the benefit of priority from the prior Japanese Patent Application No. 2010-037792 filed on Feb. 23, 2010, with the Japanese Patent Office, the entire contents of which are incorporated herein by reference.

FIELD

The disclosures herein generally relate to exposure methods and methods for manufacturing semiconductor devices, and particularly relate to an exposure method and a method for manufacturing a semiconductor device by use of reticle exposure and electron beam exposure.

BACKGROUND

In the manufacture of semiconductor devices, patterns such as integrated circuit interconnect patterns are formed by use of lithography. In the lithography process, light passing through a reticle (i.e., mask) that embodies a desired pattern is shone on a photosensitive resist film disposed on a semiconductor wafer, thereby printing the desired pattern in the resist film. A development process is then performed to remove needless portions of the resist film to form a desired resist pattern. When this is done, fine portions of the pattern may not be reproduced with sufficient accuracy. A corner of the pattern may be rounded and retreat. A notch portion may be rounded and expand. A fine line may become thinner and broken.

In a method referred to as hybrid exposure, both light exposure by use of a reticle and electron beam exposure are used to reproduce fine portions of a target pattern with sufficient accuracy. In general, fine line patterns with a pattern width narrower than a certain threshold among the given exposure patterns are assigned as electron-beam exposure patterns. Among the given exposure patterns, also, the perimeters of patterns with a pattern width wider than the threshold are extracted and assigned as electron-beam exposure patterns. Further, the core portions of these patterns with a pattern width wider than the threshold are extracted and assigned as reticle exposure patterns. The threshold may be set equal to 100 nm, for example. A reticle is formed based on the generated reticle exposure patterns. Light passing through the reticle is then shone on a resist film, thereby printing rough patterns. An electron beam is then shone on the resist film according to the electron-beam exposure patterns, thereby printing fine pattern portions.

An electron-beam exposure method draws patterns line by line, so that the excessive use of electron-beam exposure slows down the throughput of wafer production. When all the fine line patterns and all the pattern perimeters are categorically subjected to electron-beam exposure, portions for which sufficient accuracy can be attained by reticle exposure, i.e., portions for which electron-beam exposure may not be necessary, are all processed by electron-beam exposure that is time consuming. The use of a simple pattern classification method that determines electron-beam exposure patterns and reticle exposure patterns in a straightforward manner may end up excessively using electron-beam exposure. This results in a lengthy exposure process.

Patent Document 1 discloses a technology in which thresholds for line width and intervals are set as rules, and opposing pattern edges of exposure patterns are extracted based on these thresholds. The extracted pattern edge portions are then assigned as electron-beam exposure patterns. Other portions are assigned as reticle exposure patterns. The use of simple rules to reduce the number of electron-beam exposure portions may overcome the problem of lengthy exposure time. However, such practice may assign portions suitable for electron-beam exposure as portions for reticle exposure, resulting in lowered accuracy.

[Patent Document 1] Japanese Laid-open Patent Publication No. 04-155812

SUMMARY

According to an aspect of the embodiment, an exposure method includes generating a reticle exposure pattern based on a target pattern, performing a lithography simulation based on the reticle exposure pattern to generate a simulation pattern that simulates a resist pattern formed by reticle exposure, generating differential data between the target pattern and the simulation pattern, generating a first electron-beam exposure pattern based on the differential data, generating a reticle based on the reticle exposure pattern, performing an optical exposure process with respect to a resist by use of the reticle, and performing an electron-beam exposure process with respect to the resist based on the first electron-beam exposure pattern.

According to another aspect of the embodiment, a method of making a semiconductor device includes generating a reticle exposure pattern based on a target pattern, performing a lithography simulation based on the reticle exposure pattern to generate a simulation pattern that simulates a resist pattern formed by reticle exposure, generating differential data between the target pattern and the simulation pattern, generating a first electron-beam exposure pattern based on the differential data, generating a reticle based on the reticle exposure pattern, performing an optical exposure process with respect to a resist by use of the reticle, and performing an electron-beam exposure process with respect to the resist based on the first electron-beam exposure pattern.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 1 is a flowchart illustrating a process flow of a first embodiment of an exposure method;

FIG. 3 is a drawing illustrating an example of a table that defines rules used in a classification process;

FIG. 5 is a drawing illustrating the way each pattern is processed in the pattern classification process of FIG. 4 when a differential pattern is a projecting part;

FIG. 6 is a drawing illustrating the way each pattern is processed in the pattern classification process of FIG. 4 when a differential pattern is a retreating part;

FIGS. 7A and 7B are drawings for explaining a pattern check process;

FIGS. 8A and 8B are drawings for explaining a pattern type check process;

FIG. 9 is a flowchart illustrating the details of a retreating-part correction process;

FIG. 10 is a flowchart illustrating the details of a projecting-part correction process;

FIG. 19 is a drawing illustrating the way a frame generating process is performed in the pattern classification process of FIG. 18 when a differential pattern is a projecting part;

FIG. 20 is a drawing illustrating the removal of a portion from a reticle exposure pattern by use of a generated frame;

FIG. 21 is a drawing illustrating a reticle exposure pattern from which a portion is removed by use of a generated frame;

FIGS. 24A through 24D are drawings illustrating an example of the method of manufacturing a semiconductor device.

DESCRIPTION OF EMBODIMENTS

In the following, embodiments will be described with reference to the accompanying drawings.

FIG. 1 is a flowchart illustrating a process flow of a first embodiment of an exposure method. Data input into the exposure method of FIG. 1 is input drawing data 10. The input drawing data 10 is data indicative of exposure patterns generated from the circuit layout data of a semiconductor device that is to be manufactured. Specifically, the layout data is subjected to conversion by use of conversion information such as information indicative of a layer in which patterns are placed and sizing information indicative of sizes of the patterns, thereby generating exposure pattern data.

Figure 2A:
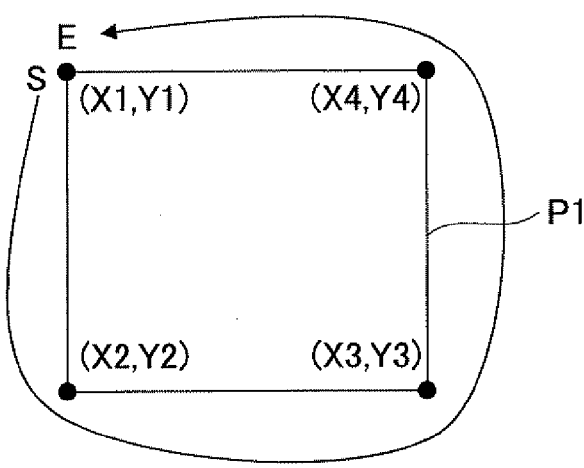
FIGS. 2A through 2C are drawings illustrating examples of the structure of a pattern file.
Figure 2B:
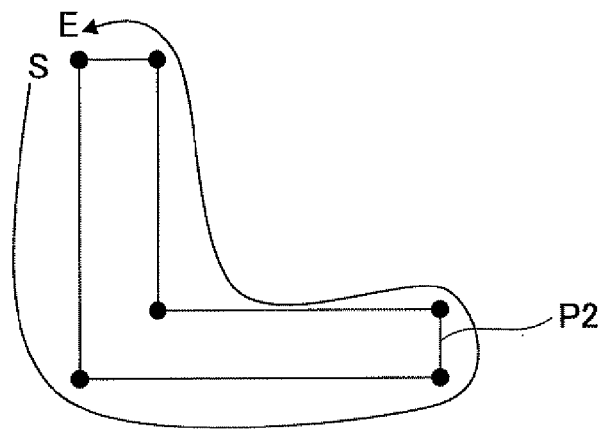
Figure 2C:
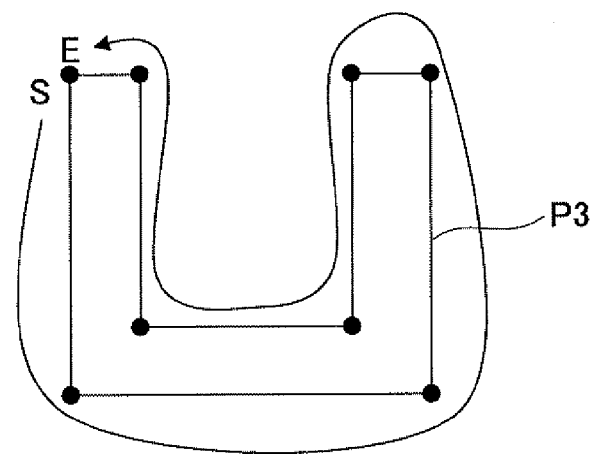

FIGS. 2A through 2C are drawings illustrating examples of the structure of a pattern file. A rectangle pattern P1 illustrated in FIG. 2A, an L-letter-shape pattern P2 illustrated in FIG. 2B, and a U-letter-shape pattern P3 illustrated in FIG. 2C are provided as exposure patterns for interconnection portions that constitute a circuit, for example. These exposure patterns are provided as separate data sets on a pattern-by-pattern basis. The rectangle pattern P1 illustrated in FIG. 2A is defined by four coordinate sets (X1, Y1), (X2, Y2), (X3, Y3), and (X4, Y4). A specific data structure that defines the rectangle pattern P1 illustrated in FIG. 2A includes data "P1: X1, Y1, X2, Y2, X3, Y3, X4, Y4, X1, Y1", which is a set of coordinates indicative of the vertexes that are arranged counterclockwise from a start point S to an end point E (which is the same as the start point S). The L-letter-shape pattern P2 illustrated in FIG. 2B and the U-letter-shape pattern P3 illustrated in FIG. 2C are also defined in a similar manner. These plural pattern data may be consolidated and stored as a single file. In such a file, coordinate data indicative of a series of vertexes defining a corresponding figure are stored and associated with a corresponding pattern identifier (e.g., P1, P2, P3, or the like used in the above example). Plural patterns each defined by such a data structure may be provided as the input drawing data 10.

Referring to FIG. 1 again, a pattern check is made in step S1 with respect to the input drawing data 10. This pattern check classifies the input exposure patterns of the input drawing data 10 into either reticle exposure patterns 11 or electron-beam exposure patterns (EB exposure patterns) 12. Namely, each one of the exposure patterns each defined by a data structure described in connection with FIG. 2 may be classified into either the reticle exposure patterns 11 or the electron-beam exposure patterns 12 by the classification process of step S1 illustrated in FIG. 1. In so doing, line width and interval thresholds may be used, such that a pattern having a line width narrower than a predetermined threshold and having line intervals narrower than a predetermined threshold may be classified into the electron-beam exposure patterns 12. The classification process of step S1 is implemented by a digital computer that processes the input drawing data 10 provided as digital data. Subsequent data processes are also performed by the digital computer.

FIG. 3 is a drawing illustrating an example of a table that defines rules used in the classification process. The table illustrated in FIG. 3 defines different pattern line widths 90 nm, 100 nm, and 110 nm in respective rows, and also defines different pattern intervals 85 nm, 90 nm, and 95 nm in respective columns. At each intersection between a row and a column, "EB" indicative of electron-beam exposure or "RT" indicative of reticle exposure is specified. In this example, a given pattern is classified as an electron-beam exposure pattern only if this pattern has a line width of 90 nm and also has an interval of 85 nm or 90 nm, which is defined by a distance between this pattern and an adjacent pattern. Namely, this pattern is registered as one of the electron-beam exposure patterns 12. If a given pattern has a line width of 100 nm, this pattern is classified as a reticle exposure pattern regardless of the distance from an adjacent pattern. Namely, this pattern is registered as one of the reticle exposure patterns 11.

Turning to FIG. 1 again, a check is made in step S2 with respect to each pattern in the reticle exposure patterns 11 as to whether an OPC (optical proximity correction) process is to be performed. Upon determining that an OPC process is to be performed, an OPC process is performed in step S3 with respect to the relevant patterns. In the case of fine exposure patterns, adjacent patterns may come in contact with each other due to the optical proximity effect. Also, corners of patterns may be rounded, and lines may become thinner and broken. In consideration of this, pattern distortion is estimated, and, then, pattern data is modified in such a manner as to cancel or suppress the distortion. This correction process ensures that a desired pattern shape be formed on a wafer. This is referred to as an OPC process. In the OPC process, corrected reticle exposure patterns 11A are calculated from the data of the reticle exposure patterns 11 based on correction information indicative of correction rules for the optical proximity effect. A reticle is produced by use of the corrected reticle exposure patterns 11A. An exposure process is then performed by use of this reticle to create a resist pattern that is close to a desired target pattern because of a reduced optical proximity effect. Upon determining in step S2 that an OPC process is not to be performed, the patterns for which no OPC process is performed are included in the reticle exposure patterns 11A.

In step S4, lithography simulation is performed with respect to each pattern of the reticle exposure patterns 11A. In the lithography simulation, the behavior of light and the photochemical reactions of photosensitive resist used in reticle exposure are simulated by digital data processing. This simulation produces a computed simulation pattern that simulates a resist pattern created by reticle exposure. Specifically, the numerical aperture of a lens used in an optical projection system, the coherent factor of a light system, the wavelength of light used in exposure, the size of the reticle exposure patterns 11A, etc. are used as inputs to calculate the spatial distribution of a light pattern used in the exposure process. Further, the distribution of exposure energy in a resist film is calculated, followed by calculating the photochemical reactions of the resist responsive to the exposure energy, and then calculating the amount of dissolution of the resist in a development process based on these calculations. In this manner, the shape of a resist pattern that would be obtained by a development process is calculated as a simulation pattern.

In step S5, a pattern classification process is performed. In this pattern classification process, differential data between the simulation pattern and the target pattern (i.e., reticle exposure pattern 11) indicative of a desired resist pattern shape is generated separately for each pattern of the reticle exposure patterns 11A. Based on the generated differential data, each pattern is classified as either a faulty pattern (which is to be corrected) or a faultless pattern (which is not to be corrected). The reticle exposure patterns 11A that are determined to be faultless patterns are stored in memory as reticle exposure patterns 11B, which are part of the pattern data used in the creation of a reticle. The reticle exposure patterns 11A that are determined to be faulty patterns are stored in memory as reticle exposure patterns 13 together with differential patterns 14.

Figure 4:
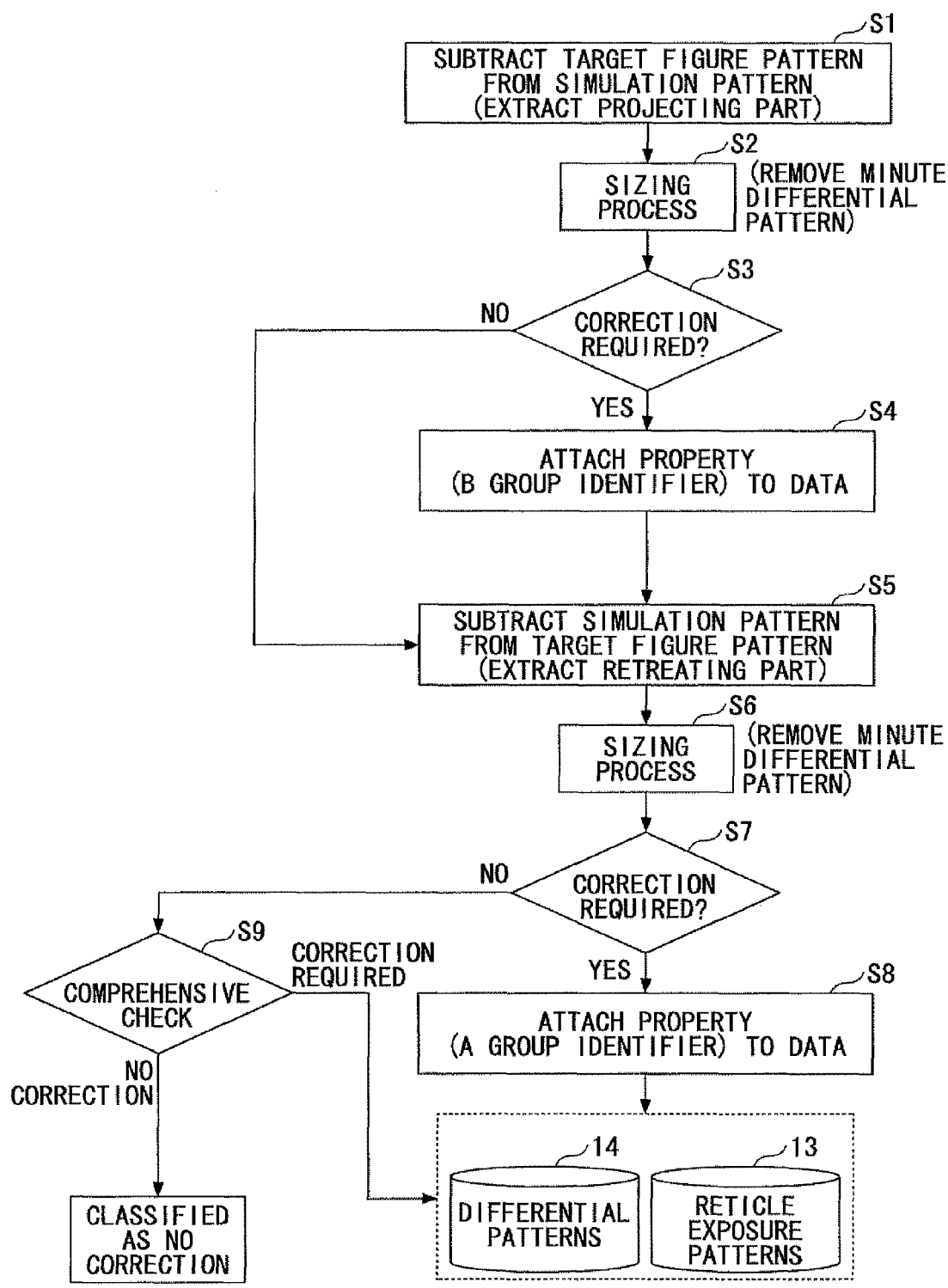
FIG. 4 is a flowchart illustrating the detail of the pattern classification process.

FIG. 4 is a flowchart illustrating the detail of the pattern classification process. FIG. 5 is a drawing illustrating the way each pattern is processed in the pattern classification process of FIG. 4 when the differential pattern is a projecting part. FIG. 6 is a drawing illustrating the way each pattern is processed in the pattern classification process of FIG. 4 when the differential pattern is a retreating part.

In step S1 of FIG. 4, a target figure pattern (i.e., reticle exposure pattern 11) is subtracted from a simulation pattern on a simulation-pattern-specific basis. It may be noted that a simulation pattern may be image data comprised of a matrix of pixels having respective pixel values. In accordance with this data structure, image data comprised of pixels that has a shape indicated by the data format described in connection with FIG. 2 may be used as the target figure pattern that is used in the subtraction process. A portion where the result of subtraction becomes minus is set to zero. The subtraction process serves to extract a differential pattern 14 that is a projecting part. The fact that the differential pattern 14 is a projecting part means that the differential pattern 14 constitutes a portion of the simulation pattern that projects from the reticle exposure pattern 11, i.e., a portion of the simulation pattern that is larger than a target size. An example of such a subtraction process is illustrated in FIG. 5. Subtracting a target figure pattern 22 from a simulation pattern 21 produces a projecting part 23. This is because the simulation pattern 21 is larger than the target figure pattern 22 at a portion 22A of the target figure pattern 22.

In step S2 of FIG. 4, sizing is performed separately for each differential pattern 14 (i.e., for each projecting part 23), thereby removing a minute differential pattern. Namely, as illustrated in FIG. 5, minus sizing that removes a predetermined width of a perimeter is performed with respect to the projecting part 23, thereby generating a minus-sizing-performed projecting part 24. When this is done, a projecting part 23 smaller than a predetermined size disappears. After this, plus sizing that expands an area by adding a predetermined width to the perimeter is performed with respect to the minus-sizing-performed projecting part 24, thereby producing a plus-sizing-performed projecting part 25.

In step S3 of FIG. 4, a check is made with respect to each projecting part 25 as to whether a correction process is to be performed. Namely, a check is made as to whether the projecting part 25 has a negligible size or has such a size that it had better be removed by a correction process. Specifically, correction may be performed for a projecting part 25 having a size larger than a predetermined threshold (e.g., 3 nm), and may not be performed for a projecting part 25 having a size no larger than the predetermined threshold. One of the outer boundary pixels of the projecting part 25 that corresponds to the outer boundary pixels of the simulation pattern 21 may be selected. Distances between the selected pixel and all the pixels of the outer boundary pixels of the projecting part 25 that correspond to interior pixels of the simulation pattern 21 are then calculated, followed by obtaining the minimum distance among the calculated distances. Similarly, the above-noted minimum distance is obtained with respect to each one of the outer boundary pixels of the projecting part 25 that corresponds to the outer boundary pixels of the simulation pattern 21. A maximum distance among the obtained minimum distances may then be derived and used as the above-noted size of the projecting part 25.

In step S4 of FIG. 4, a property indicative of a faulty projecting part is added to the data of the differential pattern 14 that corresponds to the projecting part 25 that is determined to be subjected to a correction process. In this example, data indicating a B group is added as property data to the differential pattern 14. FIG. 5 illustrates the addition of the B-group property data.

In step S5 of FIG. 4, a simulation pattern is subtracted from a target figure pattern (i.e., reticle exposure pattern 11) on a simulation-pattern-specific basis. A portion where the result of subtraction becomes minus is set to zero. The subtraction process serves to extract a differential pattern 14 that is a retreating part. The fact that the differential pattern 14 is a retreating part means that the differential pattern 14 constitutes a portion of the reticle exposure pattern 11 where the simulation pattern retreats from the reticle exposure pattern 11, i.e., where the simulation pattern is smaller than a target size. An example of such a subtraction process is illustrated in FIG. 6. Subtracting a simulation pattern 32 from a target figure pattern 31 produces a retreating part 33. This is because the simulation pattern 32 is smaller than the target figure pattern 31 at a portion 32A of the simulation pattern 32.

In step S6 of FIG. 4, sizing is performed separately for each differential pattern 14 (i.e., for each retreating part 33), thereby removing a minute differential pattern. Namely, as illustrated in FIG. 6, minus sizing that removes a predetermined width of a perimeter is performed with respect to the retreating part 33, thereby generating a minus-sizing-performed retreating part 34. When this is done, a retreating part 33 smaller than a predetermined size disappears. After this, plus sizing that expands an area by adding a predetermined width to the perimeter is performed with respect to the minus-sizing-performed retreating part 34, thereby producing a plus-sizing-performed retreating part 35.

In step S7 of FIG. 4, a check is made with respect to each retreating part 35 as to whether a correction process is to be performed. Namely, a check is made as to whether the retreating part 35 has a negligible size or has such a size that it had better be restored by a correction process. Specifically, correction may be performed for a retreating part 35 having a size larger than a predetermined threshold (e.g., 1 nm), and may not be performed for a retreating part 35 having a size no larger than the predetermined threshold. One of the outer boundary pixels of the retreating part 35 that corresponds to the outer boundary pixels of the target figure pattern 31 may be selected. Distances between the selected pixel and all the pixels of the outer boundary pixels of the retreating part 35 that correspond to interior pixels of the target figure pattern 31 are then calculated, followed by obtaining the minimum distance among the calculated distances. Similarly, the above-noted minimum distance is obtained with respect to each one of the outer boundary pixels of the retreating part 35 that corresponds to the outer boundary pixels of the target figure pattern 31. A maximum distance among the obtained minimum distances may then be derived and used as the above-noted size of the retreating part 35.

In step S8 of FIG. 4, a property indicative of a faulty retreating part is added to the data of the differential pattern 14 that corresponds to the retreating part 35 that is determined to be subjected to a correction process. In this example, data indicating an A group is added as property data to the differential pattern 14. FIG. 6 illustrates the addition of the A-group property data.

In final step S9, a comprehensive check is performed with respect to each pattern that is determined to be not subjected to a correction process, thereby checking again whether correction is required. When a projecting part and a retreating part are adjacent to each other, for example, a consolidated portion may needs correction despite the fact that each of the projecting part and the retreating part is separately determined to be not subjected to a correction process. The comprehensive check as in step S9 may be provided for the purpose of dealing with such a portion.

Referring to FIG. 1 again, a pattern check process is performed in step S6 after the pattern classification process of step S5 described above. In the pattern check process, a check is made separately for each of the reticle exposure patterns 13 as to whether all the corresponding differential patterns 14 are retreating parts. A subsequent procedure differs depending on the results of this check. If all the differential patterns 14 are retreating parts with respect to a pattern of interest selected from the reticle exposure patterns 13, the pattern of interest and the corresponding differential patterns are illustrated as reticle exposure patterns 13A and differential patterns 14A in FIG. 1. The reticle exposure patterns 13A are stored in memory as pattern data used in the creation of a reticle. The differential patterns 14A are subjected to a retreating part correction process of step S8, which will be described later. If the differential patterns 14 of a pattern of interest selected from the reticle exposure patterns 13 include at least one projecting part, the pattern of interest and the corresponding differential patterns are illustrated as reticle exposure patterns 13B and differential patterns 14B in FIG. 1. The reticle exposure patterns 13B and the differential patterns 14B are subjected to next step S7.

FIGS. 7A and 7B are drawings for explaining a pattern check process. As illustrated in FIG. 7A, a differential pattern set 41 corresponding to a reticle exposure pattern of interest (i.e., a set of differential patterns obtained from this reticle exposure pattern) includes both a retreating part 14-1 and a projecting part 14-2. Namely, the simulation pattern for this reticle exposure pattern of interest retreats at one point, and projects at another point. In this case, the differential pattern set 41 is included in the differential patterns 14B. A differential pattern set 42 corresponding to another reticle exposure pattern of interest includes only a projecting part 14-3. This differential pattern set 42 is thus included in the differential patterns 14B. As illustrated in FIG. 7B, on the other hand, a differential pattern set 43 corresponding to another reticle exposure pattern of interest includes only a retreating part 14-4. This differential pattern set 43 is thus included in the differential patterns 14A.

Referring to FIG. 1 again, a pattern type check is performed in step S7. In this process, the group described in the property is checked with respect to each pattern of the differential patterns 14B. If the property of a given pattern of the differential patterns 14B is the A group (which indicates a faulty retreating part), this pattern is subjected to the retreating-part correction process of step S8. If the property of a given pattern of the differential patterns 14B is the B group (which indicates a faulty projecting part), this pattern is subjected to the projecting-part correction process of step S9.

FIGS. 8A and 8B are drawings for explaining a pattern type check process. As illustrated in FIG. 8A, a property 52 of a differential pattern 51 indicates the A group. In this case, the differential pattern 51 is a retreating pattern, and is thus subjected to a retreating-part correction process. As illustrated in FIG. 8B, a property 54 of a differential pattern 53 indicates the B group. In this case, the differential pattern 53 is a projecting pattern, and is thus subjected to a projecting-part correction process.

Referring to FIG. 1 again, in the retreating-part correction process of step S8, electron-beam exposure patterns 17 are generated based on the differential data. Specifically, the electron-beam exposure patterns 17 are generated to restore (i.e., fill) a retreating part with respect to a portion where the simulation pattern retreats from the target pattern. In the projecting-part correction process of step S9, further, a portion surrounding a projecting part is removed from the reticle exposure pattern with respect to the projecting part of the simulation pattern that projects from the target pattern. In this manner, each reticle exposure pattern is modified based on the differential data to generate modified reticle exposure patterns 15. Electron-beam exposure patterns 16 are then generated to restore (i.e., fill) the surrounding portions that are removed by the modification processes. The modified reticle exposure patterns 15 are stored in memory as pattern data used in the creation of a reticle. Details of these retreating-part correction process and the projecting-part correction process will be described later.

FIG. 9 is a flowchart illustrating the details of the retreating-part correction process. In step S1, a check is made with respect to each of the differential patterns 14A and 14B as to whether the number of 90-degree corners in the differential pattern of interest is 0, 1, or 2. The retreating part 33 illustrated in FIG. 6, for example, corresponds to the case in which the number of 90-degree corners is 1. The number of 90-degree corners is 2 when a line end having two corners retreats, for example. The number of 90-degree corners is 0 when a continuous line becomes thinner in the middle, or becomes thinner and broken, for example.

In the case of the number of 90-degree corners being 0 or 2, a smoothing process is performed in step S2. In this smoothing process, the differential pattern of interest is transformed into the smallest rectangle that covers the entirety of the differential pattern of interest. In the case of the number of 90-degree corners being 1, a smoothing process is performed in step S3. In this smoothing process, the differential pattern of interest is transformed into the smallest rectangle that covers the entirety of the differential pattern of interest, followed by transforming this rectangle into a L-letter-shape figure having the smallest area size that covers the entirety of the differential pattern of interest.

In step S4, an OR operation is performed to integrate the processed differential pattern of interest into one set (i.e., one file) of electron-beam exposure patterns 17. In step S5, a check is made as to whether all the differential patterns of the differential patterns 14A and 14B are processed. It may be noted that, in the case of the differential patterns 14B, only the retreating parts are subjected to the retreating-part correction process. In the case of the differential patterns 14A, all the differential patterns included therein are retreating parts. Further, only the patterns having the A-group property are subjected to the retreating-part correction process. If there is still a pattern to be processed, the procedure returns to step S1 to repeat the process. If there is no pattern to be processed, the procedure comes to an end, with the electron-beam exposure patterns 17 being produced as outputs.

FIG. 10 is a flowchart illustrating the details of the projecting-part correction process. The inputs are the differential patterns 14B and the reticle exposure patterns 13B. In the case of the differential patterns 14B, only the projecting parts are subjected to the projecting-part correction process. In step S1, a projecting-art sizing process is performed with respect to each projecting part of the differential patterns 14B. In this sizing process, plus sizing that expands a projecting part by a first predetermined amount is performed to generate a first projecting-part pattern. Further, plus sizing that expands the same projecting part by a second predetermined amount larger than the first predetermined amount is performed to generate a second projecting-part pattern. Such a first projecting-part pattern may be generated by expanding the perimeter of the projecting part by +15 nm, and, then, a flag R for the identification purpose may be attached. Further, such a second projecting-part pattern may be generated by expanding the perimeter of the same projecting part by +45 nm, and, then, a flag E for the identification purpose may be attached.

Figure 11:
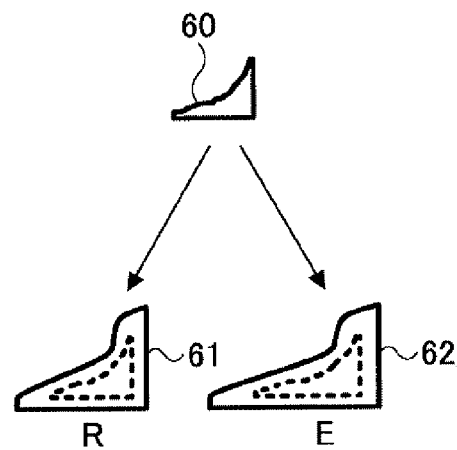
FIG. 11 is a drawing illustrating sizing processes performed on a projecting part.

FIG. 11 is a drawing illustrating sizing processes performed on a projecting part. As illustrated in FIG. 11, plus sizing that expands a projecting-part differential pattern 60 by a first predetermined amount is performed to generate a first projecting-part pattern 61. Further, plus sizing that expands the same differential pattern 60 by a second predetermined amount larger than the first predetermined amount is performed to generate a second projecting-part pattern 62. The flag R is attached to the first projecting-part pattern 61, and the flag E is attached to the second projecting-part pattern 62.

In step S2 of FIG. 10, the flags of the two projecting patterns that are generated by the sizing processes are checked, thereby applying different processes depending on the value of the checked flag. The first projecting-part pattern with the attached flag R is subjected to the processes of steps S3 through S5. The second projecting-part pattern with the attached flag E is subjected to the processes of steps S6 through S8.

In step S3, a reticle exposure pattern modification process is performed. Namely, a portion surrounding a projecting part is removed from a reticle exposure pattern of the reticle exposure patterns 13B with respect to the projecting part of the simulation pattern that projects from the target pattern. The use of an unmodified reticle exposure pattern in an exposure process would produce a resist pattern that is larger than a desired pattern. In consideration of this, the portion that causes such enlargement is removed from the reticle exposure pattern.

Figure 12:
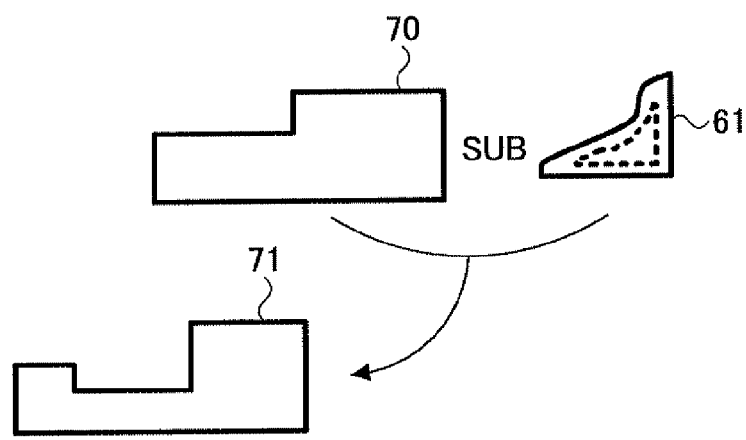
FIG. 12 is a drawing illustrating a reticle exposure pattern modification process.

FIG. 12 is a drawing illustrating the reticle exposure pattern modification process. The first projecting-part pattern 61 is subtracted from a reticle exposure pattern 70 thereby to generate a modified reticle exposure pattern 71 for which a portion surrounding the projecting part has been removed. The differential pattern 60 is expanded by the first predetermined amount in the plus sizing process of step S1, so that the area size corresponding to this first predetermined amount is removed from the reticle exposure pattern 70.

Referring to FIG. 10 again, a smoothing process is performed in step S4. In this smoothing process, the fine irregularities of edges created by the modification process are removed in the modified reticle exposure pattern generated in step S3. In step S5, an OR operation is performed to integrate the processed reticle exposure pattern of interest into one set (i.e., one file) of modified reticle exposure patterns 15.

In step S6, an electron-beam exposure pattern generating process is performed. In this electron-beam exposure pattern generating process, an electron-beam exposure pattern is generated to restore the portion that is removed from the reticle exposure pattern by the modification process of step S3. If the modification process of step S3 alone can generate a sufficiently accurate resist pattern, the process of step S6 may not be performed. In general, however, it is not easy to determine a removal amount and pattern shape that is suitable to generate an accurate resist pattern in the modification process of step S3. In consideration of this, a larger amount than necessary may be removed, followed by restoring the needlessly removed portion by use of electron-beam exposure. This can easily generate an accurate pattern.

Figure 13:
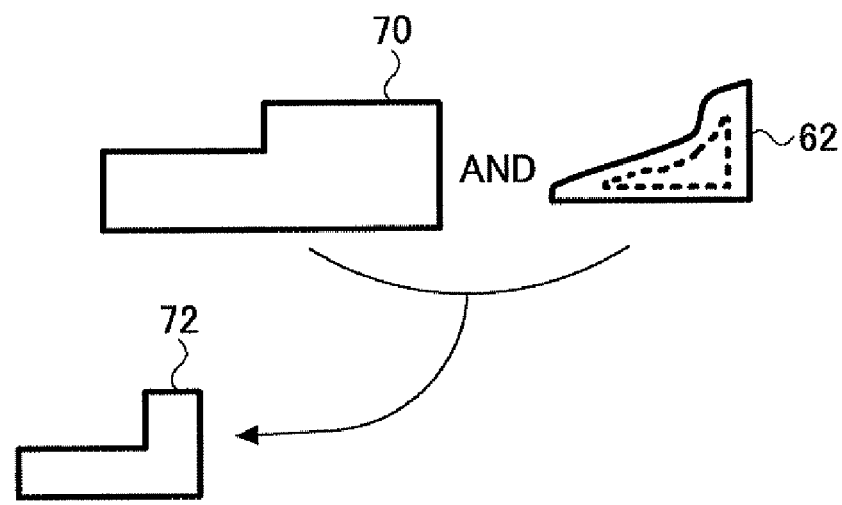
FIG. 13 is a drawing illustrating an electron-beam exposure pattern generating process.

FIG. 13 is a drawing illustrating the electron-beam exposure pattern generating process. In FIG. 13, an AND operation is performed between the reticle exposure pattern 70 and the second projecting-part pattern 62, thereby generating an electron-beam exposure pattern 72 that corresponds to the portion surrounding the projecting-part 60 illustrated in FIG. 11. The differential pattern 60 is expanded by the second predetermined amount in the plus sizing process of step S1, so that this second predetermined amount becomes the width of the electron-beam exposure pattern 72.

Referring to FIG. 10 again, a smoothing process is performed in step S7. In this smoothing process, the fine irregularities of edges created by the AND process are removed in the electron-beam exposure pattern generated in step S6. In step S8, an OR operation is performed to integrate the processed electron-beam exposure pattern 72 into one set (i.e., one file) of electron-beam exposure patterns 16.

In step S9, a check is made as to whether all the differential patterns of the differential patterns 14B are processed. In the case of the differential patterns 14B, only the projecting parts are subjected to the projecting-part correction process as was previously described. If there is still a pattern to be processed, the procedure returns to step S1 to repeat the process. If there is no pattern to be processed, the procedure comes to an end, with the reticle exposure patterns 15 and the electron-beam exposure patterns 16 being produced as outputs.

Referring to FIG. 1 again, an OR operation is performed in step S10. In this OR operation, the electron-beam exposure patterns 12, the electron-beam exposure patterns 16, and the electron-beam exposure patterns 17 are consolidated into one set (i.e., one file) of electron-beam exposure patterns 18.

Figure 14:
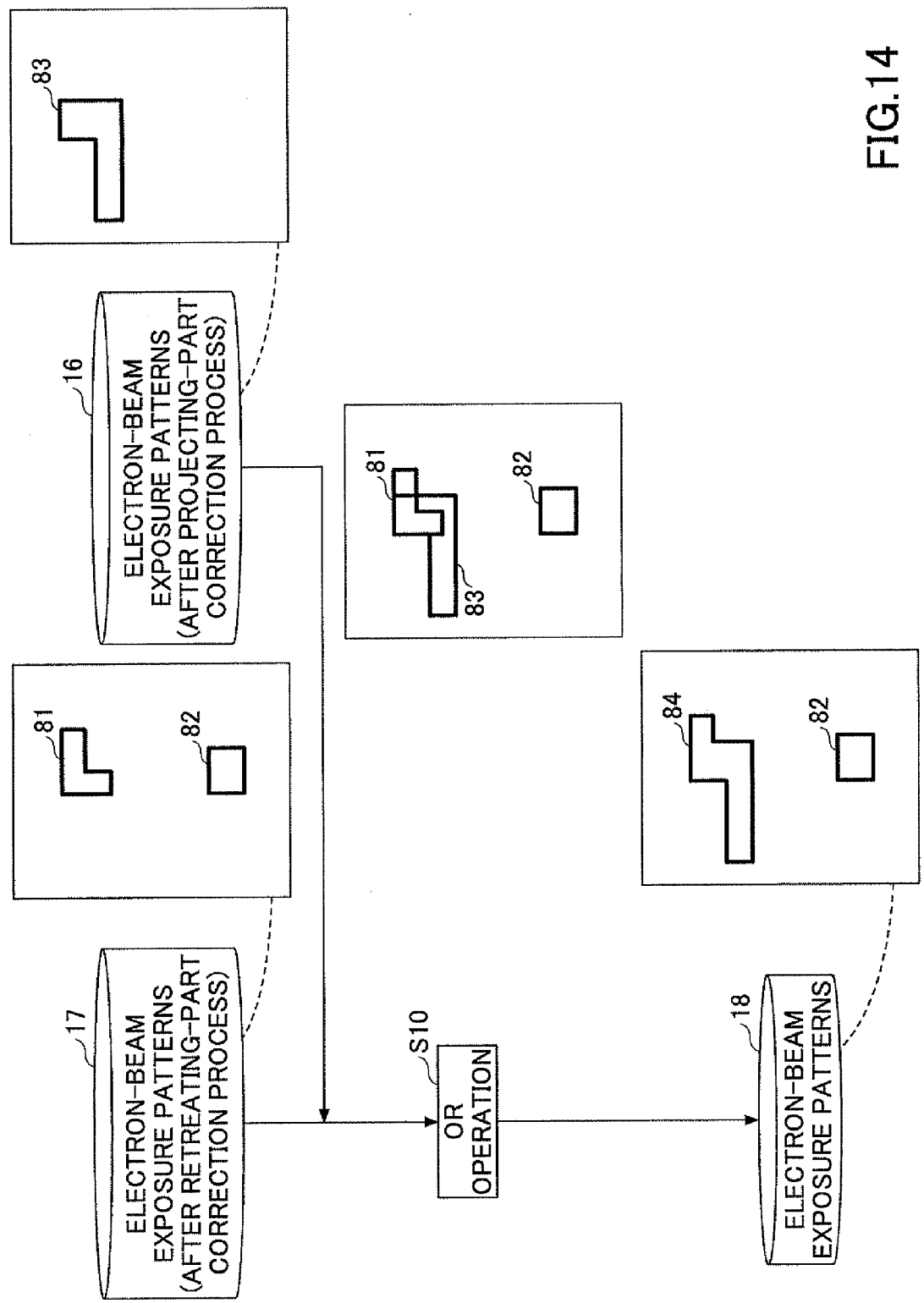
FIG. 14 is a drawing for explaining consolidation by an OR operation.

FIG. 14 is a drawing for explaining consolidation by the OR operation. FIG. 14 illustrates an example in which the electron-beam exposure patterns 17 and the electron-beam exposure patterns 16 are consolidated by an OR operation. In FIG. 14, the data of the electron-beam exposure patterns 17 include electron-beam exposure patterns 81 and 82, and the data of the electron-beam exposure patterns 16 includes an electron-beam exposure pattern 83. The OR operation of step S10 combines the electron-beam exposure patterns 81 and 83 that positionally overlap each other, thereby creating a new pattern. The data of the resulting electron-beam exposure patterns 18 thus includes electron-beam exposure patterns 82 and 84. The electron-beam exposure pattern 84 is new pattern data produced by the combining process.

Referring to FIG. 1 again, in step S11, a reticle is created based on the reticle exposure patterns 11B, the reticle exposure patterns 13A, and the reticle exposure patterns 15. In step S12, an exposure process is performed on a wafer by use of the created reticle, followed by performing an electron-beam exposure process on the wafer based on the electron-beam exposure patterns 18. With this, the exposure method illustrated in FIG. 1 comes to an end.

Figure 15:
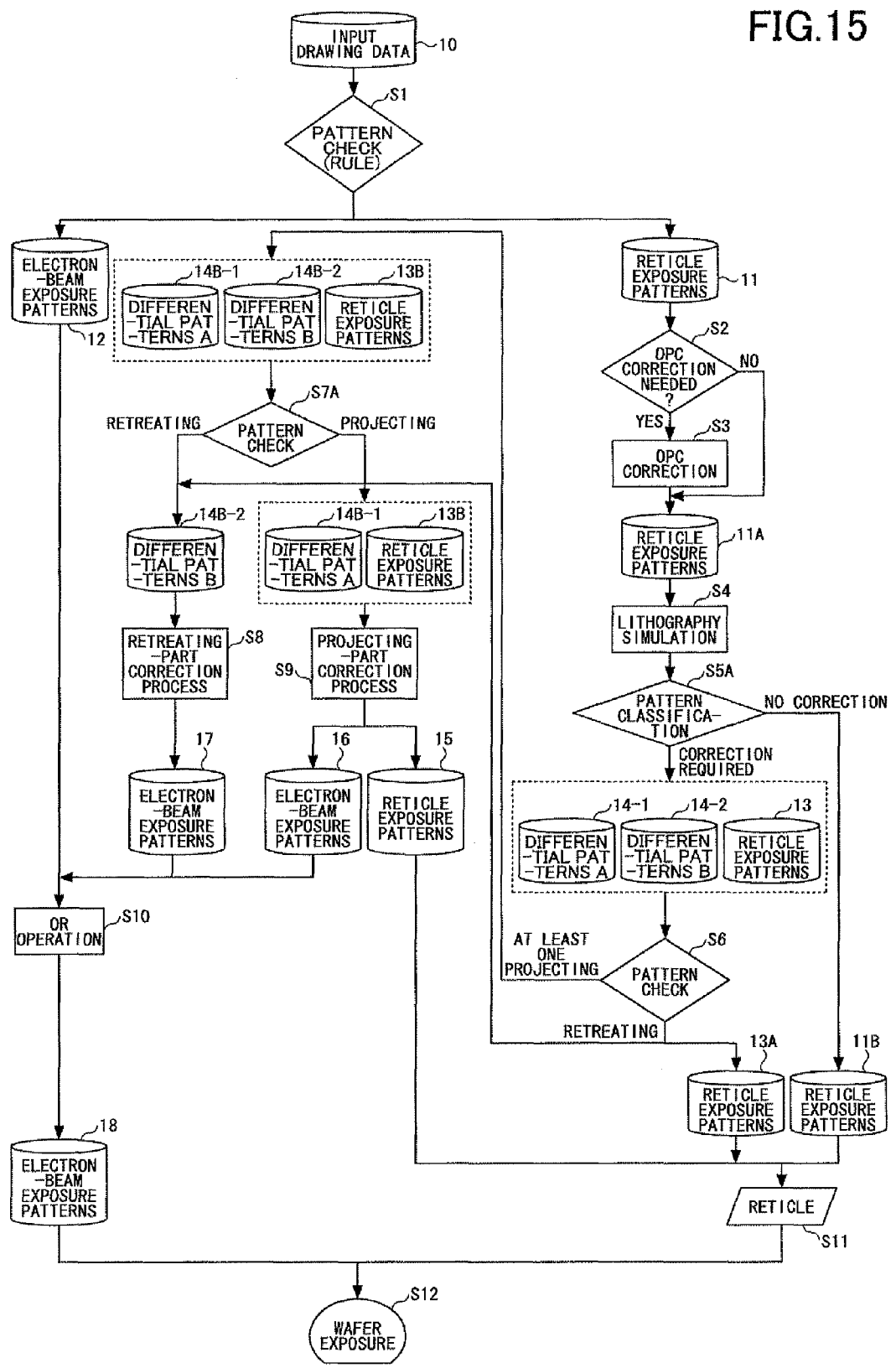
FIG. 15 is a flowchart illustrating a process flow of a second embodiment of an exposure method.

FIG. 15 is a flowchart illustrating a process flow of a second embodiment of an exposure method. In FIG. 15, the same elements and steps as those of FIG. 1 are referred to by the same numerals, and a description thereof will be omitted as appropriate. The exposure method illustrated in FIG. 15 mainly differs from the exposure method illustrated in FIG. 1 in that the pattern classification process of step S5A outputs two separate files, i.e., projecting-part differential patterns 14-1 and retreating-part differential patterns 14-2.

Figure 16:
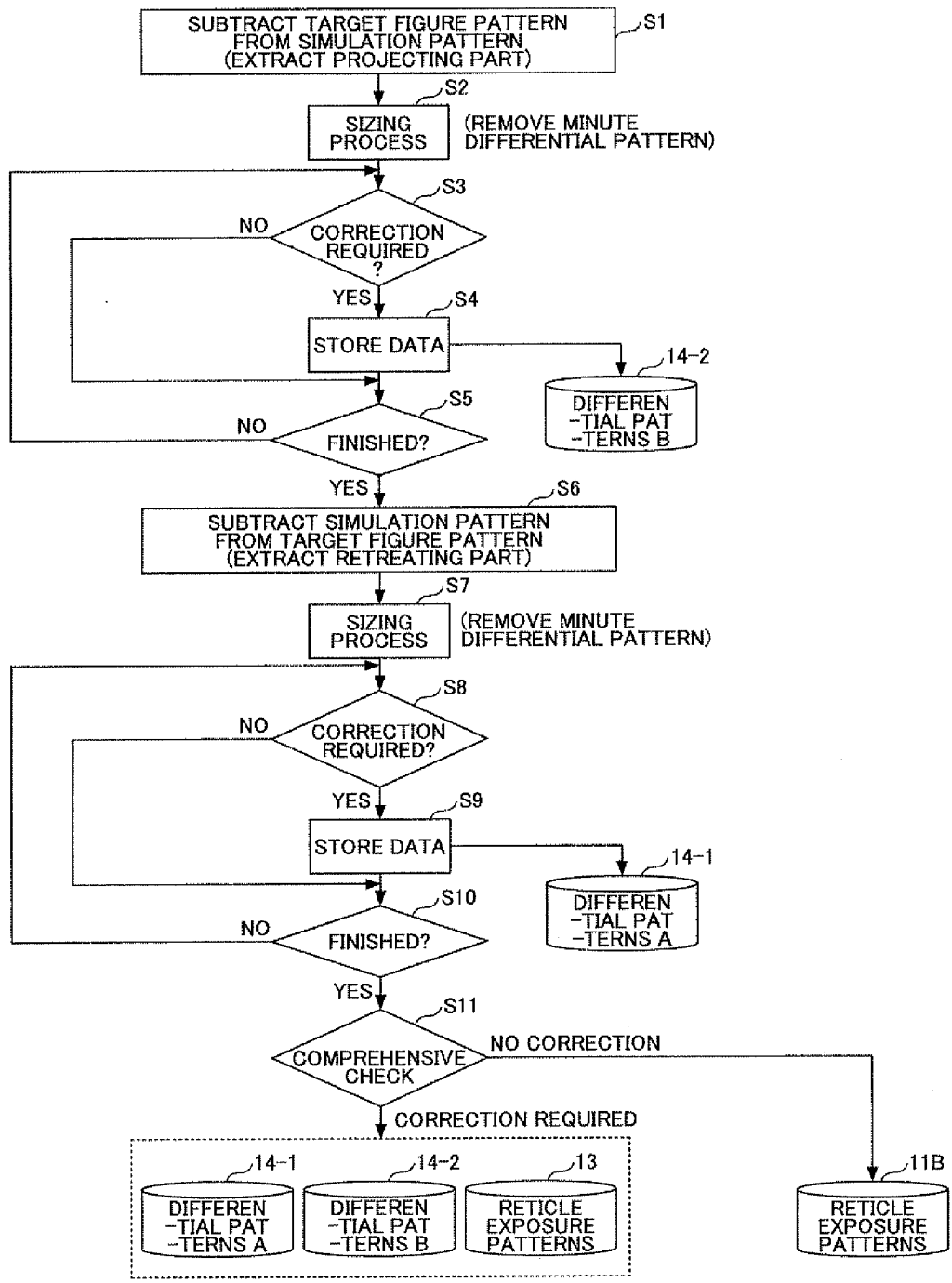
FIG. 16 is a flowchart illustrating the detail of a pattern classification process of FIG. 15.

FIG. 16 is a flowchart illustrating the detail of the pattern classification process of FIG. 15. In step S1, a target figure pattern (i.e., reticle exposure pattern 11) is subtracted from a simulation pattern on a simulation-pattern-specific basis. This is the same as or similar to step S1 illustrated in FIG. 4. In step S2, sizing is performed separately for each differential pattern (i.e., for each projecting part), thereby removing a minute differential pattern. This is the same as or similar to step S2 illustrated in FIG. 4. In step S3, a check is made as to whether a correction process is to be performed with respect to a projecting part of interest. Namely, a check is made as to whether the projecting part has a negligible size or has such a size that it had better be removed by a correction process. In this regard, this process is the same as or similar to step S3 illustrated in FIG. 4. In step S4, data of a differential pattern corresponding to the projecting part that is determined to be corrected is added to the data file of the differential patterns 14-2. When this is done, a property indicative of a faulty retreating part, e.g., a B-group property, may be added to the differential patterns 14-2 for the sake of convenience in subsequent processes. In step S5, a check is made as to whether all the differential patterns obtained in step S1 are processed. If there is still a pattern to be processed, the procedure returns to step S3 to repeat the process. If there is no pattern to be processed, the procedure proceeds to step S6.

In step S6, a simulation pattern is subtracted from a target figure pattern (i.e., reticle exposure pattern 11) on a simulation-pattern-specific basis. This is the same as or similar to step S5 illustrated in FIG. 4. In step S7, sizing is performed separately for each differential pattern (i.e., for each retreating part), thereby removing a minute differential pattern. This is the same as or similar to step S6 illustrated in FIG. 4. In step S8, a check is made as to whether a correction process is to be performed with respect to a retreating part of interest. Namely, a check is made as to whether the retreating part has a negligible size or has such a size that it had better be removed by a correction process. In this regard, this process is the same as or similar to step S7 illustrated in FIG. 4. In step S9, data of a differential pattern corresponding to the retreating part that is determined to be corrected is added to the data file of the differential patterns 14-1. When this is done, a property indicative of a faulty retreating part, e.g., an A-group property, may be added to the differential patterns 14-1 for the sake of convenience in subsequent processes. In step S10, a check is made as to whether all the differential patterns obtained in step S6 are processed. If there is still a pattern to be processed, the procedure returns to step S8 to repeat the process. If there is no pattern to be processed, the procedure proceeds to step S11. In step S11, a comprehensive check is performed with respect to each pattern that is determined to be not subjected to a correction process, thereby checking again whether correction is required. This is the same as or similar to step S9 illustrated in FIG. 4.

Referring to FIG. 15 again, a pattern check process is performed in step S6 after the pattern classification process of step S5A described above. This pattern classification process is the same as or similar to step S6 illustrated in FIG. 1. The only difference is that the differential patterns 14 are divided into the differential patterns 14-1 and 14-2 from the beginning. If all the differential patterns included in at least one of 14-1 and 14-2 and corresponding to a pattern of interest selected from the reticle exposure patterns 13 are retreating parts, the pattern of interest is stored in memory as reticle exposure patterns 13A. The corresponding differential patterns are subjected, as differential patterns 14B-2, to the retreating part correction process of step S8. This retreating-part correction process is the same as or similar to the retreating-part correction process of step S8 illustrated in FIG. 1. If the differential patterns included in at least one of 14-1 and 14-2 and corresponding to a pattern of interest selected from the reticle exposure patterns 13 include at least one projecting part, the pattern of interest and the corresponding differential patterns are subjected, as the reticle exposure patterns 13B and differential patterns 14B-1 and 14B-2, to next step S7A.

In step S7A of FIG. 15, a process to allocate data according to pattern types is performed. In this process, the data of the differential patterns 14B-2 that are faulty retreating parts are subjected to the retreating-part correction process of step S8, and the data of the differential patterns 14B-1 that are faulty projecting parts, together with the reticle exposure patterns 13B, are subjected to the projecting-part correction process of step S9. This projecting-part correction process of step S9 is the same as or similar to the projecting-part correction process of step S9 illustrated in FIG. 1. Namely, a portion surrounding a projecting part is removed from the reticle exposure pattern with respect to the projecting part of the simulation pattern that projects from the target pattern. In this manner, each reticle exposure pattern is modified based on the differential data to generate modified reticle exposure patterns 15. Electron-beam exposure patterns 16 are then generated to restore (i.e., fill) the surrounding portions that are removed by the modification processes. The modified reticle exposure patterns 15 are stored in memory as pattern data used in the creation of a reticle.

In the manner described above, the differential patterns are divided into a data file of retreating-part differential patterns and a data file of projecting-part differential patterns. Except for this, the second embodiment illustrated in FIG. 15 performs the same or similar procedure and processes as those of the first embodiment illustrated in FIG. 1 to perform an exposure method.

Figure 17:
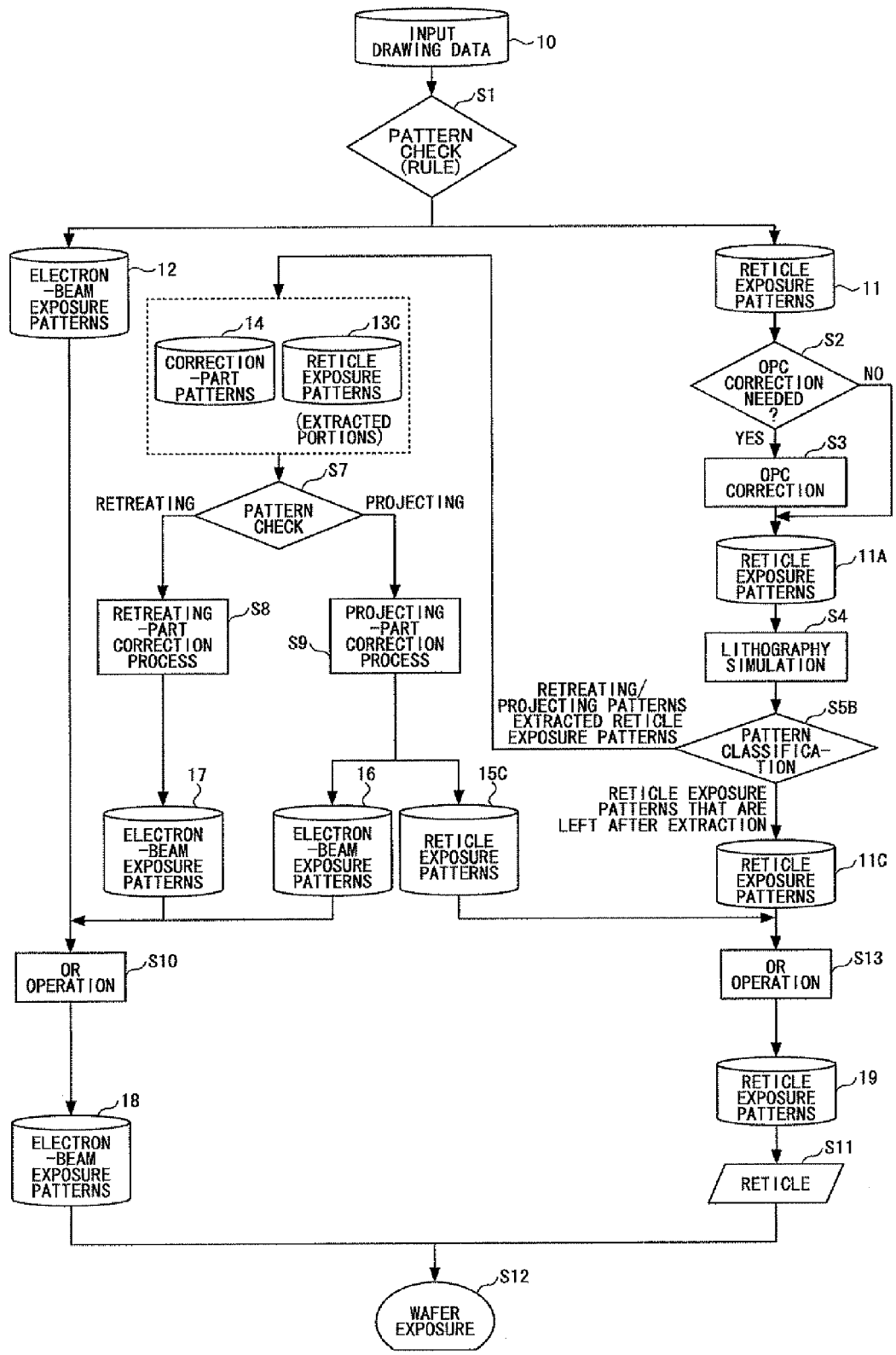
FIG. 17 is a flowchart illustrating a process flow of a third embodiment of an exposure method.

FIG. 17 is a flowchart illustrating a process flow of a third embodiment of an exposure method. In FIG. 17, the same elements and steps as those of FIG. 1 are referred to by the same numerals, and a description thereof will be omitted as appropriate. The exposure method illustrated in FIG. 7 differs from the first embodiment illustrated in FIG. 1 in how the reticle exposure patterns to be corrected are treated. Specifically, a pattern classification process of step S5B classifies the reticle exposure patterns into faulty portions and faultless portions.

Figure 18:
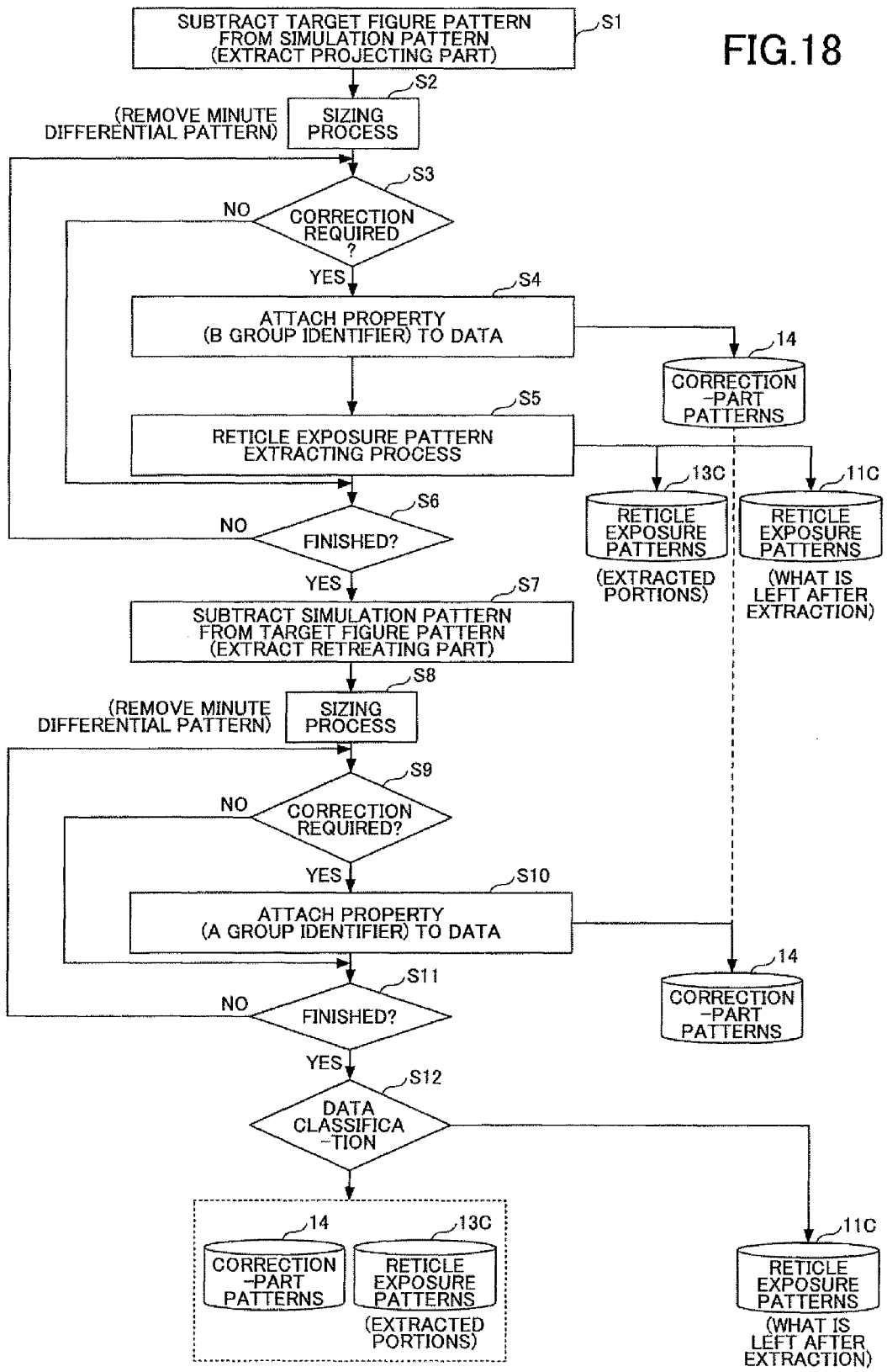
FIG. 18 is a flowchart illustrating the detail of a pattern classification process of FIG. 17.

FIG. 18 is a flowchart illustrating the detail of the pattern classification process of FIG. 17. In step S1, a target figure pattern (i.e., reticle exposure pattern 11) is subtracted from a simulation pattern on a simulation-pattern-specific basis. This is the same as or similar to step S1 illustrated in FIG. 4. In step S2, sizing is performed separately for each differential pattern (i.e., for each projecting part), thereby removing a minute differential pattern. This is the same as or similar to step S2 illustrated in FIG. 4. In step S3, a check is made as to whether a correction process is to be performed with respect to a projecting part of interest. Namely, a check is made as to whether the projecting part has a negligible size or has such a size that it had better be removed by a correction process. In this regard, this process is the same as or similar to step S3 illustrated in FIG. 4. In step S4, a property indicative of a faulty projecting part, e.g., a B-group property, may be attached, and the data of the projecting part of interest is added to the data file of differential patterns 14. In step S5, a reticle exposure pattern extracting process, which will be described in the following, is performed. This reticle exposure pattern extracting process generates reticle exposure patterns 13C corresponding to the extracted portion and reticle exposure patterns 11C corresponding to what is left after removing the extracted portion. In step S6, a check is made as to whether all the obtained differential patterns are processed. If there is still a pattern to be processed, the procedure returns to step S3 to repeat the process. If there is no pattern to be processed, the procedure proceeds to step S7.

FIG. 19 is a drawing illustrating the way a frame generating process is performed in the pattern classification process of FIG. 18 when the differential pattern is a projecting part. FIG. 20 is a drawing illustrating the removal of a portion from a reticle exposure pattern by use of a generated frame. FIG. 21 is a drawing illustrating a reticle exposure pattern from which a portion is removed by use of a generated frame. As illustrated in FIG. 19, plus sizing that expands a differential pattern 90 by 60 nm, for example, is performed to generate an expanded differential pattern 91. A rectangular frame 92 that covers the entirety of the differential pattern 91 is then generated. The rectangular frame 92 is used to perform a process that removes a portion of a reticle exposure pattern. As illustrated in FIG. 20, an AND operation is performed between the rectangular frame 92 and a target figure pattern 93, thereby extracting a reticle exposure pattern 94 that corresponds to a portion 93A from which the simulation pattern projects. The reticle exposure pattern 94 is stored in memory as the reticle exposure patterns 13C corresponding to extracted portions in FIG. 18. As illustrated in FIG. 21, the rectangular frame 92 is subtracted from the target figure pattern 93, thereby generating a reticle exposure pattern 95 that is left after removing the portion 93A from which the simulation pattern projects. The reticle exposure pattern 95 is stored in memory as the reticle exposure patterns 11C corresponding to what is left after removing extracted portions in FIG. 18.

In step S7, a simulation pattern is subtracted from a target figure pattern (i.e., reticle exposure pattern 11) on a simulation-pattern-specific basis. This is the same as or similar to step S5 illustrated in FIG. 4. In step S8, sizing is performed separately for each differential pattern (i.e., for each retreating part), thereby removing a minute differential pattern. This is the same as or similar to step S6 illustrated in FIG. 4. In step S9, a check is made as to whether a correction process is to be performed with respect to a retreating part of interest. Namely, a check is made as to whether the retreating part has a negligible size or has such a size that it had better be removed by a correction process. In this regard, this process is the same as or similar to step S7 illustrated in FIG. 4. In step S10, a property indicative of a faulty retreating part, e.g., an A-group property, may be attached, and the data of the retreating part of interest is added to the data file of differential patterns 14. In step S11, a check is made as to whether all the differential patterns obtained in step S7 are processed. If there is still a pattern to be processed, the procedure returns to step S9 to repeat the process. If there is no pattern to be processed, the procedure proceeds to step S12. In step S12, a data classification process is performed. In this data classification process, the differential patterns 14 and the reticle exposure patterns 13C corresponding to extracted portions are subjected to the pattern type check of step S7 of FIG. 17, and the reticle exposure patterns 11C corresponding to what is left after removing extracted portions are subjected to the OR operation of step S13 of FIG. 17. It may be noted that this data classification process produces the reticle exposure patterns 11C such that all the reticle exposure patterns for which no projecting-part correction is performed are also included in the reticle exposure patterns 11C.

Referring to FIG. 17 again, the pattern-type process of step S7, the retreating-part correction process of step S8, and the projecting-part correction process of step S9 are the same as or similar to those corresponding processes illustrated in FIG. 1. It may be noted, however, that each of the reticle exposure patterns corrected by the projecting-part correction process of step S9 is the entirety of a reticle exposure pattern in FIG. 1. In FIG. 17, on the other hand, each of the reticle exposure patterns corrected by the projecting-part correction process of step S9 is a faulty extracted portion that is extracted from a reticle exposure pattern. Namely, in respect of a projecting part of the simulation pattern that projects from the target pattern, a portion surrounding the projecting part is removed from the extracted reticle exposure pattern that is a larger extracted portion surrounding the projecting part. In this manner, each extracted reticle exposure pattern is modified based on the differential data to generate modified extracted reticle exposure patterns 15C. Electron-beam exposure patterns 16 are then generated to restore (i.e., fill) the surrounding portions that are removed by the modification processes. The modified extracted reticle exposure patterns 15C are subjected to the OR operation of step S13.

In step S13 of FIG. 17, the OR operation is performed. In this OR operation, the modified extracted reticle exposure patterns 15C and the reticle exposure patterns 11C corresponding to what is left after removing extracted portions are combined together to restore unitary reticle exposure patterns. It may be noted that a reticle exposure pattern for which no projecting-part correction is performed remains as it is, without being combined with another pattern. In this manner, reticle exposure patterns 19 for use in the creation of a retile are generated.

Figure 22:
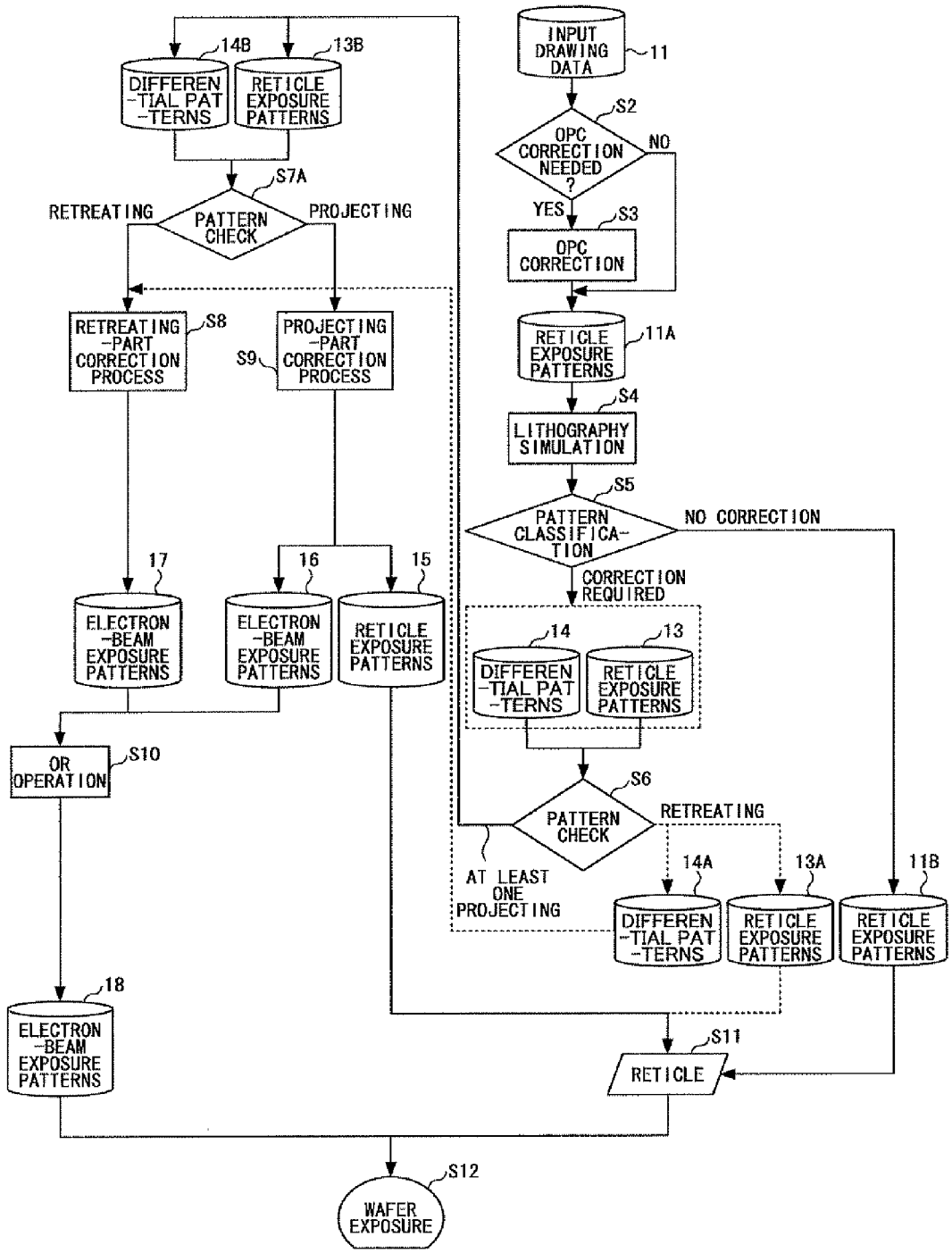
FIG. 22 is a flowchart illustrating a process flow of a fourth embodiment of an exposure method.

FIG. 22 is a flowchart illustrating a process flow of a fourth embodiment of an exposure method. In FIG. 22, the same elements and steps as those of FIG. 1 are referred to by the same numerals, and a description thereof will be omitted as appropriate. The exposure method illustrated in FIG. 22 differs from the method of the first embodiment illustrated in FIG. 1 in that the pattern check process of step S1 is removed, and the input drawing data 10 is directly used as reticle exposure patterns. Namely, the OPC process of step S2 uses the input drawing data 10 as the data to be processed.

The fourth embodiment of the exposure method illustrated in FIG. 22 does not use electron-beam exposure for a relatively large pattern for which electron-beam exposure may be superfluous. Namely, if a difference between a lithography simulation pattern and a target figure pattern is smaller than a threshold, then, an optical lithography process alone may be used to perform an exposure process. If the results of the lithography simulation indicate that some portions may be faulty, then, these portions are subjected to a correction process in the same manner as in the first embodiment. In the first and fourth embodiments, the retreating-part correction process and the projecting-part correction process are performed as such need arises. Alternatively, only one of the retreating-part correction process and the projecting-part correction process may be performed as such need arises. Namely, provision may be made such that the projecting-part correction process is not performed, for example.

Figure 23:
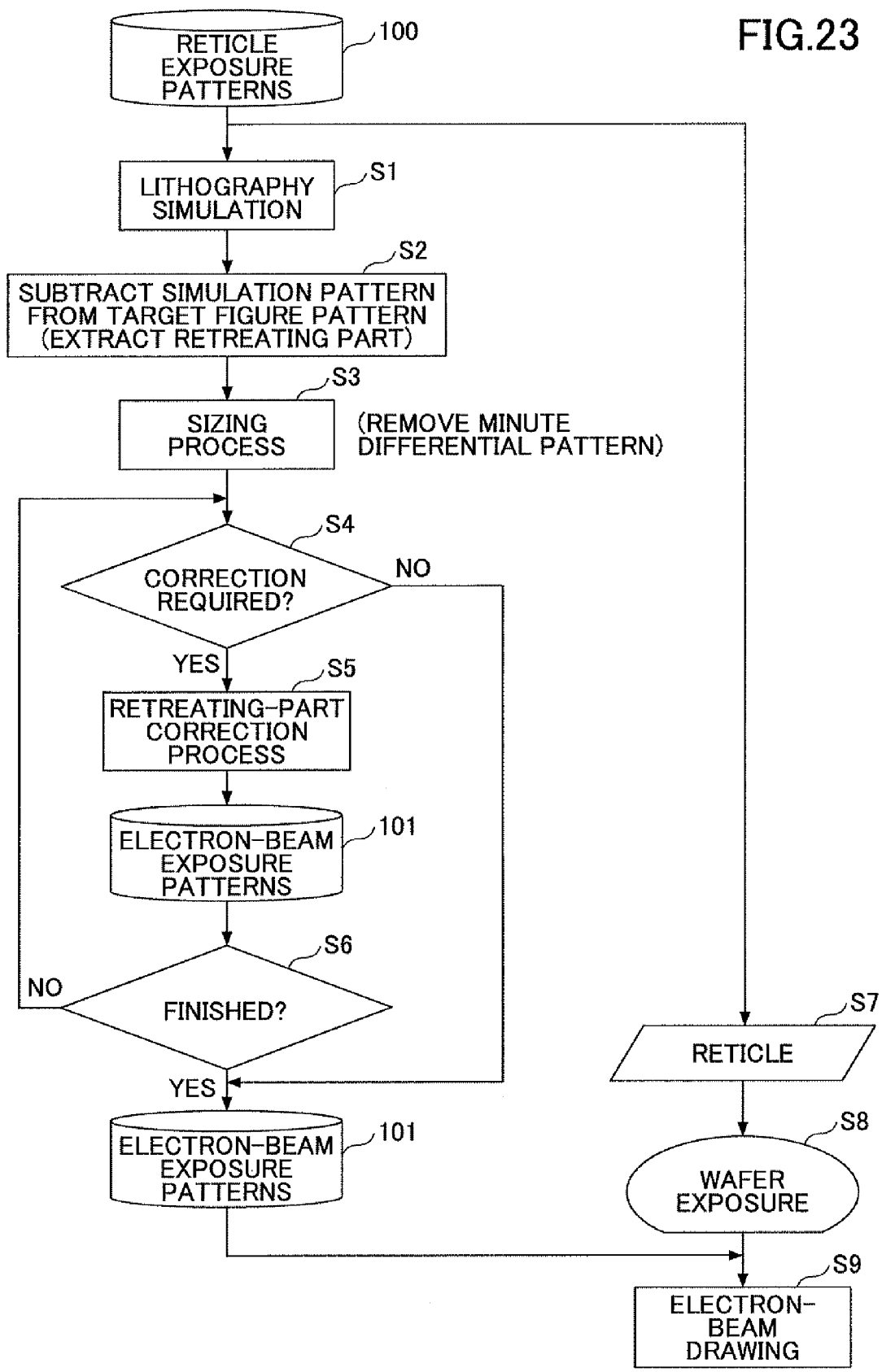
FIG. 23 is a flowchart illustrating a process flow of a fifth embodiment of an exposure method.

FIG. 23 is a flowchart illustrating a process flow of a fifth embodiment of an exposure method. Data input into the exposure method of FIG. 23 is reticle exposure patterns 100. The reticle exposure patterns 100 are data generated from the circuit layout data of a semiconductor device that is to be manufactured. Specifically, the layout data is subjected to conversion by use of conversion information such as information indicative of a layer in which patterns are placed and sizing information indicative of sizes of the patterns, thereby generating exposure pattern data.

In step S1, lithography simulation is performed with respect to each pattern of the reticle exposure patterns 100. The lithography simulation is the same as or similar to the one used in the exposure method of FIG. 1. In step S2, a simulation pattern is subtracted from a target figure pattern (i.e., reticle exposure pattern 100) on a simulation-pattern-specific basis. A portion where the result of subtraction becomes minus is set to zero. The subtraction process serves to extract a differential pattern that is a retreating part. In step S3, sizing is performed separately for each differential pattern, thereby removing a minute differential pattern. Namely, minus sizing that removes a predetermined width of a perimeter is performed with respect to each retreating part, thereby generating a minus-sizing-performed retreating part. This serves to eliminate a retreating part that is smaller than a predetermined size. After this, plus sizing that expands an area by a predetermined width of a perimeter is performed with respect to the minus-sizing-performed retreating part, thereby producing a plus-sizing-performed retreating part.

In step S4, a retreating part of interest is selected, and a check is made as to whether a correction process is to be performed with respect to this retreating part. Namely, a check is made as to whether the retreating part has a negligible size or has such a size that it had better be restored by a correction process. Specifically, correction may be performed for a retreating part having a size larger than a predetermined threshold (e.g., 1 nm), and may not be performed for a retreating part having a size no larger than the predetermined threshold.

In step S5, a retreating-part correction process for generating an electron-beam exposure pattern is performed based on the differential data (i.e., retreating part) that is determined to be corrected. Specifically, electron-beam exposure patterns 101 are generated to restore (i.e., fill) a retreating part with respect to a portion where the simulation pattern retreats from the target pattern. In step S6, a check is made as to whether all the differential patterns obtained in step S2 are processed. If there is still a pattern to be processed, the procedure returns to step S4 to repeat the process. If there is no pattern to be processed, the electron-beam exposure patterns 101 are output.

In step S7, a reticle is created based on the reticle exposure patterns 100. In step S8, an optical exposure process is performed on a wafer by use of the created reticle. In step S9, an electron-beam exposure process is performed on the wafer according to the electron-beam exposure patterns 101. With this, the exposure method illustrated in FIG. 23 comes to an end.

The fifth embodiment of the exposure method illustrated in FIG. 23 does not use electron-beam exposure when such electron-beam exposure may be superfluous. Namely, if a difference between a lithography simulation pattern and a target figure pattern is smaller than a threshold, then, an optical lithography process alone may be used to perform an exposure process. If the results of the lithography simulation indicate that some portions are faulty, then, these portions are subjected to a retreating-part correction process.

A time period allowed to be used to produce a reticle may be short. In such a case, a reticle may be created before the testing of reticle exposure data is finished. However, if the reticle exposure data is created again after the subsequent testing detects a failure in the reticle exposure data, the time period used to produce a reticle is prolonged, thereby failing to meet the required time limit. The use of the procedure of the fifth embodiment, electron-beam exposure can be used to correct a portion on the wafer when lithography simulation detects a problem of pattern retreat with respect to this portion. Namely, a desired resist pattern is obtained while meeting the required time limit for reticle production.

FIGS. 24A through 24D are drawings illustrating an example of the method of manufacturing a semiconductor device. One of the exposure methods of the first through fifth embodiments described above may be used to perform an exposure process on a wafer, thereby manufacturing a semiconductor device having a desired circuit pattern. In each of FIGS. 24A through 24D, the left-hand side of the figure illustrates a plan view taken from above a wafer, and the right-hand side of the figure illustrates a cross-sectional view taken along a line A-A' depicted in the plan view of the wafer. As illustrated in FIG. 24A, a resist 110 serving as a photosensitive agent is applied on a wafer substrate 111. After this, as illustrated in FIG. 24B, laser light 120 is shone on the resist 110 through a light shielding film 113 formed on a reticle substrate 112 such as a transparent glass plate, thereby performing an exposure process. The light shielding film 113 has a reticle exposure pattern shape that is generated by one of the exposure methods of the above-described embodiments. An exposed reticle portion 114 of the resist 110 that is exposed to light by the reticle exposure process has a shape that approximates a desired shape. Such an approximate shape may include portions that retreat relative to a target figure pattern.

As illustrated in FIG. 24C, then, an electron beam 121 is scanned according to the electron-beam exposure patterns generated by one of the exposure methods of the above-described embodiments, thereby performing an electron-beam exposure process. An electron-beam-exposed portion 115 of the resist 110 that is exposed by the electron-beam exposure process restores a portion at which the exposed reticle portion 114 retreats and fails to overlap the target figure pattern, thereby providing a shape that closely follows the target figure pattern. Thereafter, a development process is performed to remove unneeded resist portions by use of a developing solution that dissolves the resist 110, thereby producing a resist pattern having a resist removed portion 116 as illustrated in FIG. 24D. This resist pattern is used to perform an etching process, a film deposition process, an impurity implanting process, and so on to produce a desired integrated circuit.

According to at least one embodiment, an electron-beam exposure pattern is generated in response to a differential between a target pattern and a simulation pattern generated by a lithography simulation. This ensures that electron-beam exposure data is generated only for a portion that had better be processed by electron-beam exposure. Accordingly, electron-beam exposure is performed only with respect to the portions suitable for electron-beam exposure, and reticle exposure is performed with respect to the remaining portions. This ensures that an accurate pattern is printed in a resist film in a short time.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. An exposure method, comprising:
    generating a reticle exposure pattern based on a target pattern;
    performing a lithography simulation based on the reticle exposure pattern to generate a simulation pattern that simulates a resist pattern formed by reticle exposure;
    generating differential data between the target pattern and the simulation pattern;
    generating a first electron-beam exposure pattern based on the differential data;
    generating a reticle based on the reticle exposure pattern;
    performing an optical exposure process with respect to a resist by use of the reticle; and
    performing an electron-beam exposure process with respect to the resist based on the first electron-beam exposure pattern.

2. The exposure method as claimed in claim 1, further comprising modifying the reticle exposure pattern based on the differential data, wherein the generating a reticle includes generating the reticle based on the modified reticle exposure pattern.

3. The exposure method as claimed in claim 1, further comprising classifying input exposure patterns into the reticle exposure pattern and a second electron-beam exposure pattern, wherein the performing an electron-beam exposure process includes performing an electron-beam exposure process based on the first electron-beam exposure pattern and the second electron-beam exposure pattern.

4. The exposure method as claimed in claim 3, wherein the classifying the input exposure patterns is performed such that a pattern having a line width narrower than a threshold of the line width and having a line interval narrower than a threshold of the line interval is classified into the second electron-beam exposure pattern.

5. The exposure method as claimed in claim 1, wherein the generating a first electron-beam exposure pattern is performed such that a retreating part at which the simulation pattern fails to overlap the target pattern is restored by the first electron-beam exposure pattern.

6. The exposure method as claimed in claim 2, wherein the modifying the reticle exposure pattern is performed such that a portion surrounding a projecting portion of the simulation pattern that projects from the target pattern is removed, and the generating a first electron-beam exposure pattern is performed such that the removed surrounding portion is restored by the first electron-beam exposure pattern.

7. A method of manufacturing a semiconductor device, comprising:
    generating a reticle exposure pattern based on a target pattern;
    performing a lithography simulation based on the reticle exposure pattern to generate a simulation pattern that simulates a resist pattern formed by reticle exposure;
    generating differential data between the target pattern and the simulation pattern;
    generating a first electron-beam exposure pattern based on the differential data;
    generating a reticle based on the reticle exposure pattern;
    performing an optical exposure process with respect to a resist by use of the reticle; and
    performing an electron-beam exposure process with respect to the resist based on the first electron-beam exposure pattern.

8. The method as claimed in claim 7, further comprising modifying the reticle exposure pattern based on the differential data, wherein the generating a reticle includes generating the reticle based on the modified reticle exposure pattern.

9. The method as claimed in claim 7, further comprising classifying input exposure patterns into the reticle exposure pattern and a second electron-beam exposure pattern, wherein the performing an electron-beam exposure process includes performing an electron-beam exposure process based on the first electron-beam exposure pattern and the second electron-beam exposure pattern.

10. The method as claimed in claim 9, wherein the classifying the input exposure patterns is performed such that a pattern having a line width narrower than a threshold of the line width and having a line interval narrower than a threshold of the line interval is classified into the second electron-beam exposure pattern.

* * * * *